United States Patent
Wang et al.

(10) Patent No.: US 11,296,304 B2
(45) Date of Patent: Apr. 5, 2022

(54) ORGANIC LIGHT-EMITTING ELEMENT

(71) Applicant: Toray Industries, Inc., Tokyo (JP)

(72) Inventors: Peng Wang, Minhang District Shanghai (CN); Guangnan Jin, Minhang District Shanghai (CN); Takeshi Ikeda, Minhang District Shanghai (CN); Jincai Li, Minhang District Shanghai (CN); Daisaku Tanaka, Otsu (JP)

(73) Assignee: TORAY INDUSTRIES, INC., Tokyo (JP)

( * ) Notice: Subject to any disclaimer, the term of this patent is extended or adjusted under 35 U.S.C. 154(b) by 67 days.

(21) Appl. No.: 16/761,553

(22) PCT Filed: Nov. 15, 2018

(86) PCT No.: PCT/CN2018/115705
§ 371 (c)(1),
(2) Date: May 5, 2020

(87) PCT Pub. No.: WO2019/100999
PCT Pub. Date: May 31, 2019

(65) Prior Publication Data
US 2021/0175475 A1 Jun. 10, 2021

(30) Foreign Application Priority Data

Nov. 23, 2017 (CN) .......................... 201711179577.3
Nov. 23, 2017 (CN) .......................... 201711179753.3

(51) Int. Cl.
*H01L 51/52* (2006.01)
*C07F 5/04* (2006.01)
*H01L 51/00* (2006.01)

(52) U.S. Cl.
CPC ............ *H01L 51/5275* (2013.01); *C07F 5/04* (2013.01); *H01L 51/008* (2013.01)

(58) Field of Classification Search
CPC ............ H01L 51/5234; H01L 51/5262; H01L 51/5275; H01L 51/5281; H01L 51/5284; H01L 51/008; H01L 2251/5315; H01L 51/005; H01L 51/0052; H01L 51/0059; H01L 51/0072; H01L 51/5012; H01L 51/5056; H01L 51/5072; H01L 51/5206; C07F 5/04; C07F 5/02
See application file for complete search history.

(56) References Cited

U.S. PATENT DOCUMENTS

| 5,925,438 | A | 7/1999 | Ota et al. |
| 7,102,282 | B1 | 9/2006 | Yamada et al. |
| 8,698,395 | B2 | 4/2014 | Im et al. |
| 9,095,033 | B2 | 7/2015 | Naraoka et al. |
| 9,985,252 | B2 | 5/2018 | Lee et al. |
| 2003/0198829 | A1* | 10/2003 | Hoag ................. H01L 51/5012 428/690 |
| 2011/0121271 | A1* | 5/2011 | Jeon ................... H01L 51/5275 257/40 |
| 2016/0133880 | A1* | 5/2016 | Lee .................... H01L 51/5281 257/40 |

FOREIGN PATENT DOCUMENTS

| CN | 102544334 A | 7/2012 |
| CN | 105590948 A | 5/2016 |
| CN | 106654049 A | 5/2017 |
| EP | 2858458 A1 | 4/2015 |
| JP | 2006302878 A | 12/2005 |
| JP | 2006156390 A | 6/2006 |
| JP | 2007103303 A | 4/2007 |
| WO | 0139554 A1 | 5/2001 |
| WO | 2011043083 A1 | 4/2011 |

OTHER PUBLICATIONS

International Search Report and Written Opinion for International Application No. PCT/CN2018/115705, dated Feb. 15, 2019, 6 pages.
Guieu, S. et al., "Luminescent bi-metallic fluoroborate derivatives of bulky salen ligands," New Journal of Chemistry, Sep. 1, 2014, vol. 38(11), pp. 5411-5414, XP055828862.
Zhou, Y. et al., "Novel binaphthyl-containing bi-nuclear boron complex with low concentration quenching effect for efficient organic light-emitting diodes," Chemical Communications, Aug. 10, 2010, vol. 46(35), pp. 6512-6514, XP055828867.
Extended European Search Report for European Application No. 18 881 946.0, dated Aug. 10, 2021, 7 pages.

* cited by examiner

*Primary Examiner* — Ermias T Woldegeorgis
(74) *Attorney, Agent, or Firm* — RatnerPrestia

(57) ABSTRACT

The present invention provides an organic light-emitting element, comprising a substrate, a first electrode, more than one organic layer film comprising a light-emitting layer, and a second electrode. The light-emitting element further comprises a cover layer. The cover layer is located on the second electrode, and comprises a high refractive layer and a low refractive layer. A material for the low refractive layer of the cover layer is a boron complex organic small molecular compound. The organic light-emitting element provided by the present invention can achieve high light-emitting efficiency and color reproducibility. The organic light-emitting element of the present invention can be used for an organic EL display, a backlight source of a liquid crystal display, illumination, a sign board, an identification lamp, etc.

13 Claims, No Drawings

ORGANIC LIGHT-EMITTING ELEMENT

CROSS REFERENCE TO RELATED APPLICATIONS

This is the U.S. National Phase application of PCT/CN2018/115705, filed Nov. 15, 2018, which claims priority to Chinese Patent Application No. 201711179577.3, filed Nov. 23, 2017 and Chinese Patent Application No. 201711179753.3, filed Nov. 23, 2017, the disclosures of each of these applications being incorporated herein by reference in their entireties for all purposes.

FIELD OF THE INVENTION

The present invention relates to an organic light-emitting element, more particularly to an organic light-emitting element having greatly improved light extraction efficiency after application of a boron complex compound, and to a light-emitting element material for use in the organic light-emitting element.

BACKGROUND OF THE INVENTION

An organic light-emitting element is a self-luminous display device, which has the characteristics of lightweight, small thickness, wide viewing angle, low power consumption, high contrast, and the like.

The principle of light emission of the organic light-emitting element lies in that light is generated when holes and electrons injected from an electrode return to a ground state via an excited state by recombination in a light-emitting layer. This light-emitting element has a feature of being lightweight and thin and capable of emitting light at a high brightness under a low driving voltage and capable of emitting light of a plurality of colors by selecting light-emitting materials, and thus has attracted much attention.

Since this research by C. W. Tang et al. of Kodak Co., Ltd. has revealed that organic thin film elements can emit light at high brightness, many studies have been conducted on their applications. The organic thin film light-emitting elements are used in main display screens of mobile phones, and achieve practical progress in terms of practicality.

However, there are still many technical topics, among which high efficiency and low power consumption of elements are major topics.

The organic light-emitting elements may be classified into-bottom-emission organic light-emitting elements and top-emission organic light-emitting elements according to a direction in which light generated by an organic light-emitting layer is emitted. In a bottom-emission organic light-emitting element, light is emitted towards the substrate side, a reflective electrode is formed on the upper part of an organic light-emitting layer, and a transparent electrode is formed on the lower part of the organic light-emitting layer. In this case, when the organic light-emitting element is an active matrix element, since a portion in which a thin film transistor is formed is opaque, a light-emitting area is reduced. On the other hand, in a top-emission organic element, a transparent electrode is formed on the upper part of an organic light-emitting layer, and a reflective electrode is formed on the lower part of the organic light-emitting layer, so that the light is emitted in a direction opposite to the substrate side. Therefore, an area through which light passes is increased and the brightness rises.

In the prior art, in order to improve the luminous efficiency of the top-emission organic light-emitting element, a method used is to form an organic cover layer on an upper translucent metal electrode through which the light of the light-emitting layer passes, so as to adjust an optical interference distance, suppress external light reflection and extinction caused by surface plasma energy movement, and the like (see Patent Documents 1 to 5).

For example, as described in Patent Document 2, an organic cover layer having a refractive index of 1.7 or more and a film thickness of 600 Å is formed on an upper translucent metal electrode of a top-emission organic light-emitting element, such that the luminous efficiency of organic light-emitting elements that emit red light and green light is improved by about 1.5 times. The material of the organic cover layer used is an amine derivative, a quinolinol complex or the like.

As described in Patent Document 4, materials with an energy gap of less than 3.2 eV will affect the blue wavelength and are not suitable for use in an organic cover layer, and an organic cover layer material used is an amine derivative having a specific chemical structure, or the like.

As described in Patent Document 5, in order to realize a blue light-emitting element having a low CIEy value, a refractive index variation of an organic cover layer material at a wavelength of 430 nm to 460 nm is Δn>0.08, and an organic cover layer material used is an anthracene derivative having a specific chemical structure, or the like.

As described above, in the prior art, an amine derivative having a specific structure and a high refractive index or a material satisfying specific parameter requirements is used as the organic cover layer material to improve the light extraction efficiency and color purity, but the problem of achieving both the high luminous efficiency and the high color purity has not been solved yet, especially in the case of preparing a blue light-emitting element.

PATENT DOCUMENTS

Patent Document 1: WO2001/039554
Patent Document 2: JP2006-156390
Patent Document 3: JP2007-103303
Patent Document 4: JP2006-302878
Patent Document 5: WO2011/043083

SUMMARY OF THE INVENTION

In order to solve the above problem of achieving both the high luminous efficiency and the high color purity, the inventors have found that when the cover layer is a laminate of a high refractive layer and a low refractive layer, and is formed from a material satisfying specific parameters, especially the low refractive layer is formed from a material satisfying specific parameter requirements and containing a boron complex compound, the problem of improving both the light extraction efficiency and the color purity can be solved. According to the present invention, it is possible to obtain an organic light-emitting element having greatly improved light extraction efficiency and excellent color purity.

The present invention according to an exemplary embodiment provides an organic light-emitting element, comprising a substrate, a first electrode, more than one organic layer film comprising a light-emitting layer, and a second electrode, wherein the light-emitting element further comprises a cover layer; the cover layer is disposed on the second electrode and comprises a high refractive layer and a low refractive layer; and the low refractive layer of the cover layer is formed from an organic small molecular compound. A covering order is the high refractive layer and the low refractive layer in order, or the low refractive layer and the high refractive layer in sequence starting from the second electrode.

The high refractive layer has a refractive index of 1.8 or more, and the low refractive layer has a refractive index of 1.5 to 1.7. The difference between the refractive index of the high refractive layer and the refractive index of the low refractive layer is 0.3 or more.

The high refractive layer is formed from at least one of the following inorganic compounds and organic compounds, wherein the inorganic compound is one or more of SiOx, SiNy, ZnS, ZnSe, ZrO or $TiO_2$, in which said x, y are an integer from 1 to 4. The organic compound is one or more of an arylamine derivative, a carbazole derivative, a benzimidazole derivative or a triazole derivative. Since an inorganic compound requires a higher temperature in the evaporation process than an organic compound, it is preferable that the high refractive index material is an organic compound.

The low refractive layer of the present invention may be located between the first electrode and the second electrode, or between the second electrode and the cover layer, or may be located on the second electrode.

Since the cover layer is disposed on the second electrode, the cover layer can effectively protect the second electrode and the organic light-emitting layer from the influences of moisture, oxygen and contaminants on the outside, thereby preventing the life of the organic light-emitting element from shortening. A top-emission light-emitting element has the advantage of enlarging a light-emitting surface than a bottom-emission light-emitting element, thereby improving the light extraction efficiency.

In the light-emitting element that achieves high luminous efficiency and high color purity by using the cover layer material, the cover layer is required to have a low refractive index layer.

As a low refractive layer material, long-chain alkanes, inorganic fluorides and the like are usually selected in the prior art. However, the long-chain alkanes are easy to decompose at high temperatures, and are difficult to be treated in an evaporation manner; and the inorganic fluorides have a defect that the evaporation temperature is high.

The prior art has also proposed a solution of using an aromatic amine derivative, a carbazole derivative, a benzimidazole derivative, a triazole derivative or the like which has a n-conjugated structure as a low refractive layer material. However, the above-mentioned aromatic amine derivative has a high attenuation coefficient, so the refractive index is as high as 1.7 or more. The attenuation coefficient and the absorption coefficient of the aromatic amine derivative have a relationship shown in the following formula (A). (in which, α: light absorption coefficient, k: attenuation coefficient, ω: light frequency, c: velocity of light)

$$\alpha = \frac{2\kappa\omega}{c} \quad (A)$$

In Formula (A), the attenuation coefficient is directly proportional to the light absorption coefficient. Therefore, the material with a high light absorption coefficient also has a high attenuation coefficient. Therefore, none of the above is suitable for use as a low refractive index material.

After in-depth research based on the above results, the inventors have found that the boron complex compound is suitable for use as a low refractive index material. In addition, it has been found that the boron complex compound has good transparency when used in the cover layer, which can improve the luminous efficiency, and thereby achieving a high-color-purity element.

As an organic material satisfying the above characteristics, it is preferable that the low-refractive layer of the cover layer is formed from a material containing the boron complex compound.

In the present invention, preferably, the boron complex compound is specifically represented by the following general formula 1:

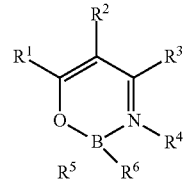

Formula 1 in which, $R^1$ to $R^4$ are the same or different and are each independently selected from one or more of the group consisting of hydrogen, deuterium, optionally substitutedoptionally substituted alkyl group, optionally substitutedoptionally substituted cycloalkyl group, optionally substitutedoptionally substituted heterocyclic group, optionally substitutedoptionally substituted alkenyl group, optionally substituted cycloalkenyl group, optionally substituted alkynyl group, optionally substituted alkoxyl group, optionally substituted alkyl sulphanyl group, optionally substituted aryl ether group, optionally substituted aryl sulfide group, optionally substituted aryl group, optionally substituted heteroaryl group, optionally substituted carbonyl group, optionally substituted carboxyl group, optionally substituted oxycarbonyl group, optionally substituted carbamoyl group, optionally substituted alkylamino group, or optionally substituted silanyl group; $R^5$ to $R^6$ are the same or different and are each independently selected from fluorine, alkoxyl group, aryl ether group or aryl group; $R^1$ and $R^2$ can be bonded to form a ring.

Due to the introduction of fluorine, the refractive index can be reduced, so $R^5$ to $R^6$ are preferably fluorine.

In the groups represented by $R^1$ to $R^6$, the alkyl group is preferably C1-C20 alkyl group, and further preferably one or more of saturated aliphatic hydrocarbon groups such as methyl group, ethyl group, n-propyl group, isopropyl group, n-butyl group, sec-butyl group, or tert-butyl group. The alkyl group may or may not have a substituent.

The cycloalkyl group is preferably C3-C20 cycloalkyl group, and further preferably one or more of saturated alicyclic hydrocarbon groups such as cyclopropyl group, cyclohexyl group, norbornyl group, or adamantyl group. The cycloalkyl group may or may not have a substituent.

The heterocyclic group is preferably C3-C20 heterocyclic group, and further preferably one or more of aliphatic rings having atoms other than carbon in a ring, such as a pyran ring, a piperidine ring, or a cyclic amide. The heterocyclic group may or may not have a substituent.

The alkenyl group is preferably C2-C20 alkenyl group, and further preferably one or more of unsaturated aliphatic hydrocarbon groups containing a double bond, such as vinyl group, allyl group, or butadienyl group. The alkenyl group may or may not have a substituent.

The cycloalkenyl group is preferably C3-C20 cycloalkenyl group, and further preferably one or more of unsaturated alicyclic hydrocarbon groups containing a double bond, such as cyclopentenyl group, cyclopentadienyl group, or cyclohexenyl group. The cycloalkenyl group may or may not have a substituent.

The alkynyl group is preferably C2-C20 alkynyl group, and further preferably unsaturated aliphatic hydrocarbon groups containing a triple bond, such as ethynyl group. The alkynyl group may or may not have a substituent.

The alkoxyl group is preferably C1-C20 alkoxyl group, and further preferably one or more of functional groups in which aliphatic hydrocarbon groups are bonded via an ether bond, such as methoxyl group, ethoxyl group or propoxyl group. The aliphatic hydrocarbon group may or may not have a substituent.

The alkyl sulphanyl group is a group in which oxygen atoms of alkoxyl group are replaced with sulfur atoms. The alkyl sulphanyl group is preferably C1-C20 alkyl sulphanyl group; alkyl of the alkyl sulphanyl group may or may not have a substituent.

The aryl ether group is preferably a C6-C60 aryl ether group, and further preferably a functional group in which aromatic hydrocarbon groups are bonded via an ether bond, such as phenoxyl group. The aryl ether group may or may not have a substituent.

The aryl sulfide group is a group in which oxygen atoms of the ether bond of the aryl ether group are replaced with sulfur atoms. Preferably, the aryl sulfide group is C6-C60 aryl sulfide group. The aromatic hydrocarbon group in the aryl sulfide group may or may not have a substituent.

The aryl group is preferably C6-C60 aryl group, and further preferably one or more of aromatic hydrocarbon groups such as phenyl group, naphthyl group, biphenyl group, phenanthryl group, phenyl terphenyl group, or pyrenyl group. The aryl group may or may not have a substituent.

The heteroaryl group is preferably C4-C60 aromatic heterocyclic group, and further preferably one or more of furyl group, thienyl group, pyrrole group, benzofuranyl group, benzothienyl group, dibenzofuranyl group, dibenzothienyl group, pyridyl group, quinolinyl group, or the like. The aromatic heterocyclic group may or may not have a substituent.

The halogen is selected from fluorine, chlorine, bromine, or iodine.

The carbonyl group, the carboxyl group, the oxycarbonyl group, the carbamoyl group or the alkylamino group may or may not have a substituent. The number of carbon atoms of the alkylamino substituent is not particularly limited, but is usually in the range of 2 to 60.

The silanyl group is represented as a functional group having a bond to a silicon atom, such as a trimethylsilyl. The silanyl group may or may not have a substituent. The number of carbon atoms of the silanyl group is not particularly limited, but is usually in the range of 3 to 20. In addition, the number of silicon atoms is usually in the range of 1 to 6.

In the case of being substituted, substituents are each independently selected from one or more of the group consisting of deuterium, halogen, C1-C15 alkyl group, C3-C15 cycloalkyl group, C3-C15 heterocyclic group, C2-C15 alkenyl group, C4-C15 cycloalkenyl group, C2-C15 alkynyl group, C1-C15 alkoxyl group, C1-C15 alkyl sulphanyl group, C6-C55 aryl ether group, C6-C55 aryl sulfide group, C6-C55 aryl group, C5-C55 aromatic heterocyclic group, carbonyl group, carboxyl group, oxycarbonyl group, carbamoyl group, C1-C40 alkylamino group or C3-C15 silanyl group with 1-5 silicon atoms.

When the boron complex compound represented by the above general formula (1) is substituted with the same or different substituents, a steric hindrance effect can be formed, thereby having excellent thin film stability.

The above results show that the use of the boron complex compound with the low refractive index and excellent thin film stability in the cover layer can solve the problems of improving both light extraction efficiency and ageing stability.

The boron complex compound in the present invention is preferably represented by the following formula 2:

Formula 2

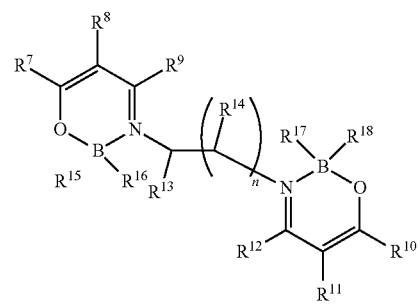

in which, $R^7$ to $R^{14}$ are the same or different and are each independently selected from one or more of the group consisting of hydrogen, deuterium, optionally substituted alkyl group, optionally substituted cycloalkyl group, optionally substituted heterocyclic group, optionally substituted alkenyl group, optionally substituted cycloalkenyl group, optionally substituted alkynyl group, optionally substituted alkoxyl group, optionally substituted alkyl sulphanyl group, optionally substituted aryl ether group group, optionally substituted aryl sulfide group group, optionally substituted aryl group, optionally substituted heteroaryl group, optionally substituted carbonyl group, optionally substituted carboxyl group, optionally substituted oxycarbonyl group, optionally substituted carbamoyl group, optionally substituted alkylamino group, or optionally substituted silanyl group; $R^{13}$ to $R^{14}$ may also be bonded to form a ring; $R^{15}$ to $R^{18}$ are the same or different and are each independently selected from fluorine, alkoxyl group, aryl ether group or aryl group; n is an integer from 1 to 3; $R^7$ and $R^8$ can be bonded to form a ring; and $R^{10}$ and $R^{11}$ can be bonded to form a ring.

In the case of being substituted, substituents are each independently selected from one or more of the group consisting of deuterium, halogen, C1-C15 alkyl group, C3-C15 cycloalkyl group, C3-C15 heterocyclic group, C2-C15 alkenyl group, C4-C15 cycloalkenyl group, C2-C15 alkynyl group, C1-C15 alkoxyl group, C1-C15 alkyl sulphanyl group, C6-C55 aryl ether group, C6-C55 aryl sulfide group, C6-C55 aryl group, C5-C55 aromatic heterocyclic group, carbonyl group, carboxyl group, oxycarbonyl group, carbamoyl group, C1-C40 alkylamino group or C3-C15 silanyl group with 1-5 silicon atoms.

Due to the introduction of fluorine, the refractive index can be reduced, so $R^{15}$ to $R^{18}$ are preferably fluorine.

The above-mentioned substituents are the same as those described above.

As shown in the Lorentz-Lorent formula, the refractive index is directly proportional to the polarizability and density. The lower the polarizability and density of a material, the smaller its refractive index.

$$\frac{n^2-1}{n^2+2} = \frac{4}{3}\pi\frac{P_\lambda}{V}$$

n: light refractive index, A: wavelength of illumination light, Px: polarization ratio, V: molecular volume The boron complex compound represented by the above general formula 2 and the alkylene-linked boron complex compound can reduce the film density, and thereby achieving a low refractive index.

The boron complex compound in the present invention is further preferably represented by the following formula 3:

Formula 3

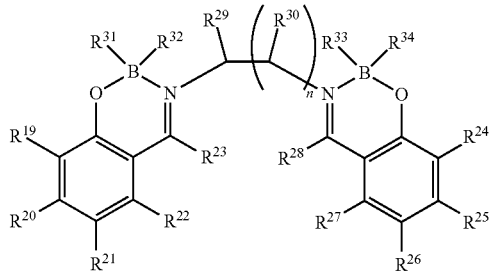

in which, $R^{19}$ to $R^{30}$ are the same or different and are each independently selected from one or more of the group consisting of hydrogen, deuterium, optionally substituted alkyl group, optionally substituted cycloalkyl group, optionally substituted heterocyclic group, optionally substituted alkenyl group 1, optionally substituted cycloalkenyl group, optionally substituted alkynyl group, optionally substituted alkoxyl group, optionally substituted alkyl sulphanyl group, optionally substituted aryl ether group group, optionally substituted aryl sulfide group group, optionally substituted aryl group, optionally substituted heteroaryl group, optionally substituted carbonyl group, optionally substituted carboxyl group, optionally substituted oxycarbonyl group, optionally substituted carbamoyl group, optionally substituted alkylamino group, or optionally substituted silanyl group; $R^{29}$ to $R^{30}$ may also be bonded to form a ring; $R^{31}$ to $R^{34}$ are the same or different and are each independently selected from fluorine, alkoxyl group, aryl ether group or aryl group; n is an integer from 1 to 3.

In the case of being substituted, substituents are each independently selected from one or more of the group consisting of deuterium, halogen, C1-C6 alkyl group, C3-C6 cycloalkyl group, C3-C6 heterocyclic group, C2-C6 alkenyl group, C4-C6 cycloalkenyl group, C2-C6 alkynyl group, C1-C6 alkoxyl group, or C1-C6 alkyl sulphanyl group.

The above-mentioned substituents are the same as those described above.

The boron complex compound represented by the above general formula 3 has an alkylene linkage, so it has a steric hindrance effect and thus has excellent thin film stability. In addition, the alkylene-linked structure can reduce the light absorption coefficient, so that a thin film can achieve a lower refractive index in the ultraviolet and visible light range. Further preferably, $R^{19}$ to $R^{30}$ are the same or different, and are each independently selected from one or more of hydrogen, optionally substituted alkyl group, optionally substituted cycloalkyl group, optionally substituted alkoxyl group, or optionally substituted alkyl sulfide group, and have the performance of reducing the polarization ratio, thereby further reducing the refractive index.

From the viewpoint of heat resistance during film formation, the boron complex compound represented by the general formula 3 is preferred.

Due to the introduction of fluorine, the refractive index can be reduced, so $R^{31}$ to $R^{34}$ are preferably fluorine.

In addition, from the viewpoints of easy synthesis and heat resistance during film formation by a resistance heating evaporation method, n is preferably 1.

In addition, from the viewpoint of reducing film density and heat resistance during film formation, the substituents are preferably one or more of methyl group, ethyl group, n-propyl group, isopropyl group, n-butyl group, tert-butyl group, methoxyl group, ethoxyl group, propoxyl group or n-butoxyl group.

The alkyl group is preferably C1-C20 alkyl group, and further preferably one or more of saturated aliphatic hydrocarbon groups, such as methyl group, ethyl group, n-propyl group, isopropyl group, n-butyl group, sec-butyl group, or tert-butyl group. The alkyl group may or may not have a substituent.

The cycloalkyl group is preferably C3-C20 cycloalkyl group, and further preferably one or more of saturated alicyclic hydrocarbon groups such as cyclopropyl group, cyclohexyl group, norbornyl group, or adamantyl group. The cycloalkyl group may or may not have a substituent.

The heterocyclic group is preferably C2-C20 heterocyclic group, and further preferably one or more of aliphatic rings having atoms other than carbon in a ring, such as a pyran ring, a piperidine ring, or a cyclic amide. The heterocyclic group may or may not have a substituent.

The alkenyl group is preferably C2-C20 alkenyl group, and further preferably one or more of unsaturated aliphatic hydrocarbon groups containing a double bond, such as vinyl group, allyl group, or butadienyl group. The alkenyl group may or may not have a substituent.

The cycloalkenyl group is preferably C3-C20 cycloalkenyl group, and further preferably one or more of unsaturated alicyclic hydrocarbon groups containing a double bond, such as cyclopentenyl group, cyclopentadienyl group, or cyclohexenyl group. The cycloalkenyl group may or may not have a substituent.

The alkynyl group is preferably C2-C20 alkynyl group, and further preferably unsaturated aliphatic hydrocarbon groups containing a triple bond, such as ethynyl group. The alkynyl group may or may not have a substituent.

The alkoxyl group is preferably C1-C20 alkoxyl group, and further preferably one or more of functional groups in which aliphatic hydrocarbon groups are bonded via an ether bond, such as methoxyl group, ethoxyl group or propoxyl group. The aliphatic hydrocarbon group may or may not have a substituent.

The alkyl sulphanyl group is a group in which oxygen atoms of alkoxyl group are replaced with sulfur atoms. The alkyl sulphanyl group is preferably C1-C20 alkyl sulphanyl group; alkyl of the alkyl sulphanyl group may or may not have a substituent.

The aryl group is preferably C6-C60 aryl group, and further preferably one or more of aromatic hydrocarbon groups, such as phenyl group, naphthyl group, biphenyl group, phenanthryl group, phenyl terphenyl group, or pyrenyl group. The aryl group may or may not have a substituent.

The heteroaryl group is preferably C4-C60 aromatic heterocyclic group, and further preferably one or more of furyl group, thienyl group, pyrrole group, benzofuranyl group, benzothienyl group, dibenzofuranyl group, dibenzothienyl group, pyridyl group, quinolinyl group, or the like. The aromatic heterocyclic group may or may not have a substituent.

The aryl ether group is preferably a C6-C40 aryl ether group, and further preferably a functional group in which aromatic hydrocarbon groups are bonded via an ether bond, such as phenoxyl. The aryl ether group may or may not have a substituent.

The aryl sulfide group is a group in which oxygen atoms of the ether bond of the aryl ether group are replaced with sulfur atoms, and is preferably a C6-C60 aryl sulfide group. The aromatic hydrocarbon group in the aryl sulfide group may or may not have a substituent.

The halogen is selected from fluorine, chlorine, bromine, or iodine.

The carbonyl group, the carboxyl group, the oxycarbonyl group, the carbamoyl group or the alkylamino group may or may not have a substituent. The number of carbon atoms of the alkylamino substituent is not particularly limited, but is usually in the range of 2 to 60.

The silanyl group is represented as a functional group having a bond to a silicon atom, such as trimethylsilyl group, triethylsilyl group, dimethyl tert-butylsilyl group, triphenylsilyl group. The silanyl group may or may not have a substituent. The number of carbon atoms of the silanyl group is not particularly limited, but is usually in the range of 1 to 40.

In the case of being substituted, substituents are each independently selected from one or more of the group consisting of deuterium, halogen, C1-C6 alkyl group, C3-C6 cycloalkyl group, C3-C6 heterocyclic group, C2-C6 alkenyl group, C4-C6 cycloalkenyl group, C2-C6 alkynyl group, C1-C6 alkoxyl group, or C1-C6 alkyl sulphanyl group.

The boron complex compound provided by the present invention can solve the problems of improving both the luminous efficiency and the color purity because of superior thin film stability and refractive index.

The boron complex compound is not particularly limited, and examples may be specifically listed below.

1

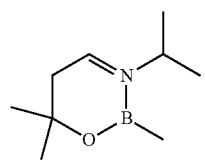

2

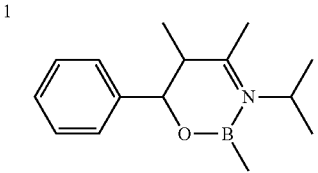

3

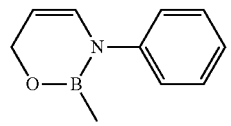

4

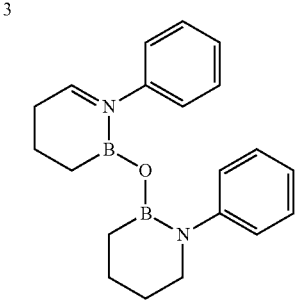

5

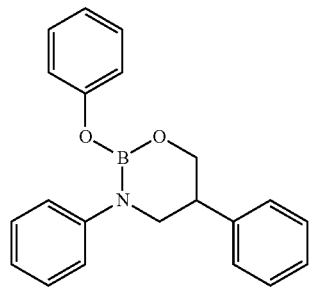

6

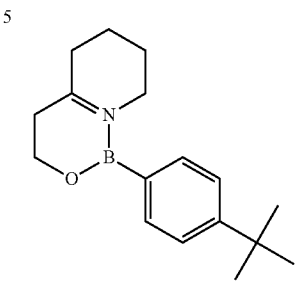

-continued
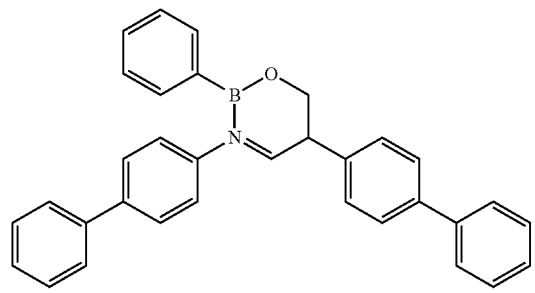
7
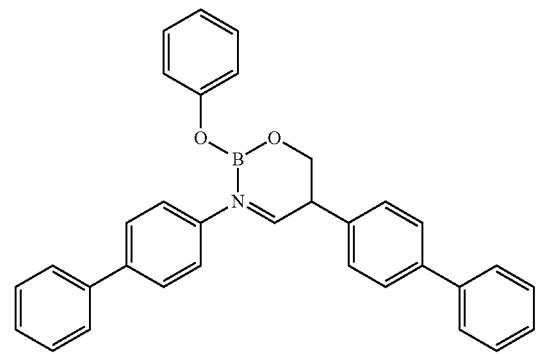
8
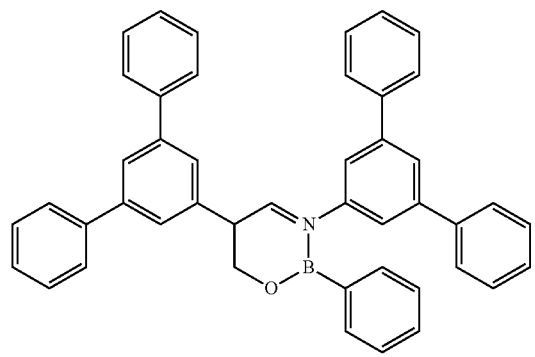
9
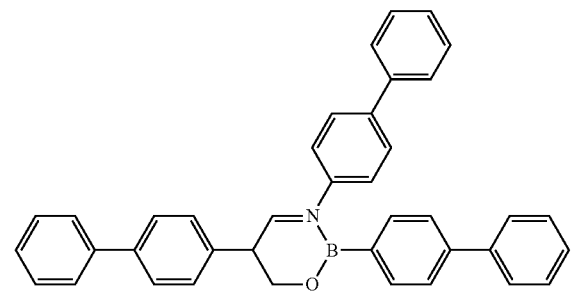
10
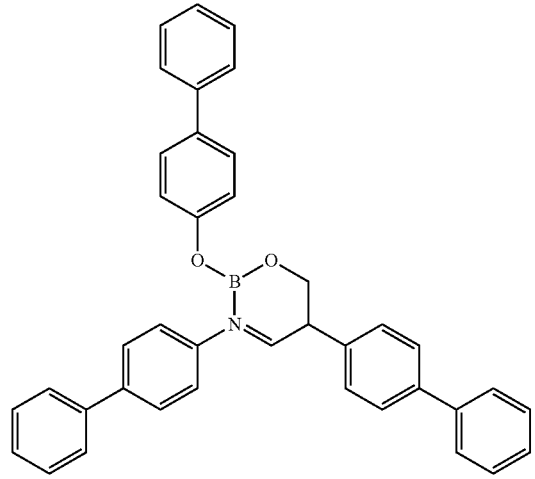
11
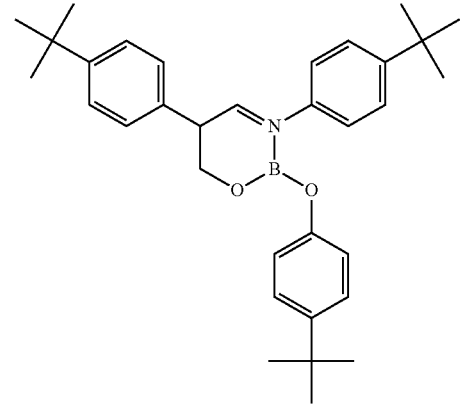
12
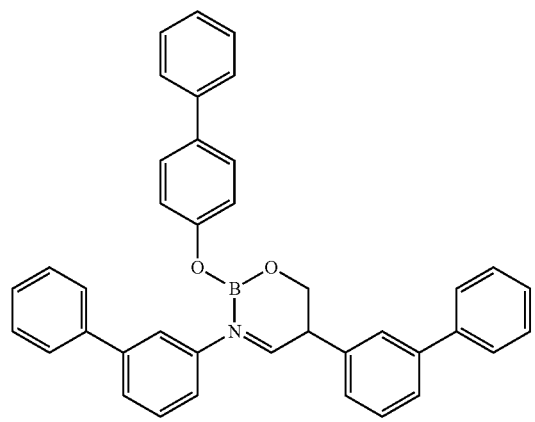
13
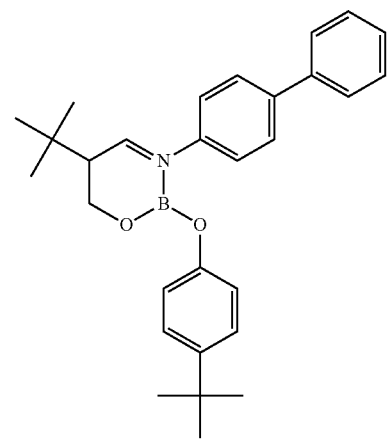
14

-continued
15
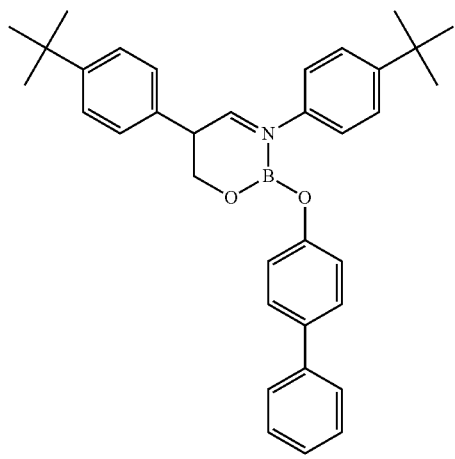
16
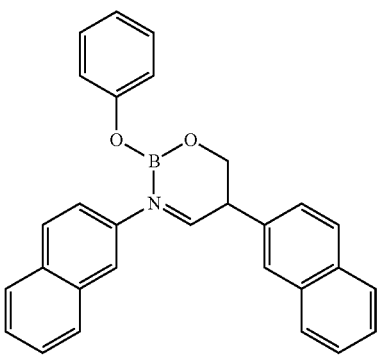
17
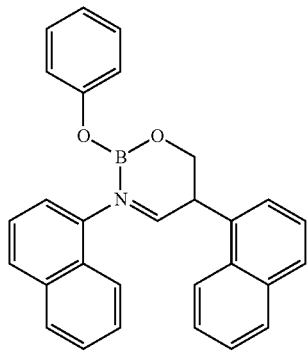
18
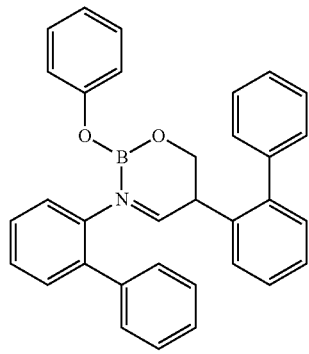
19
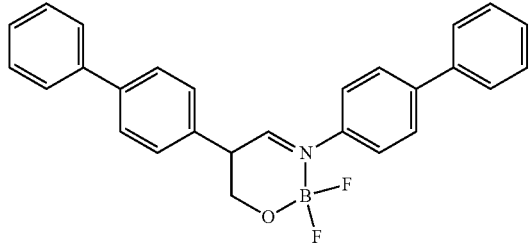
20
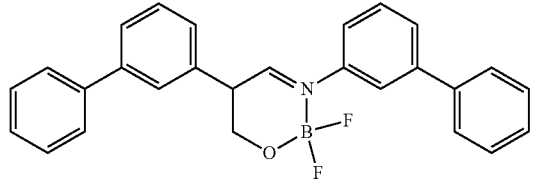
21
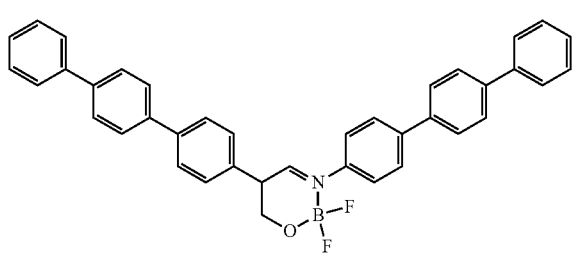
22
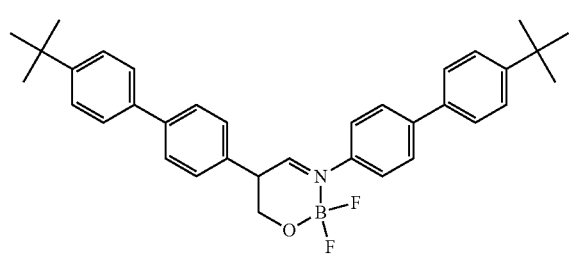
23
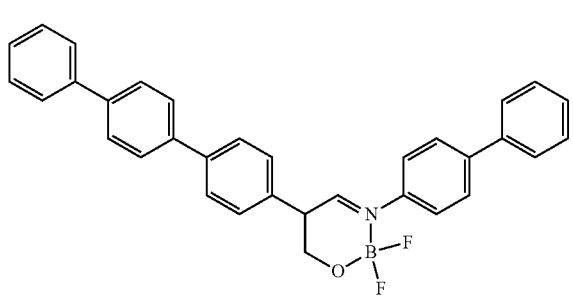
24
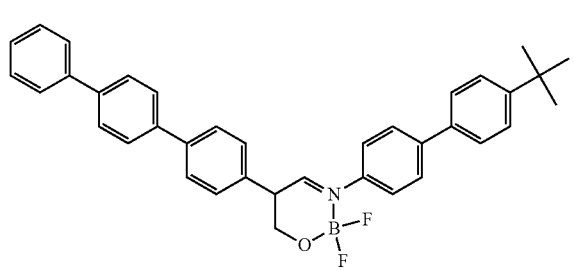

-continued
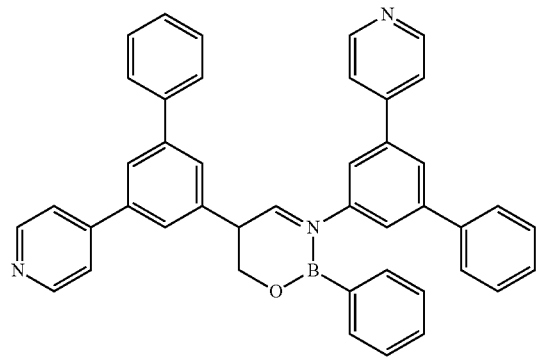
25
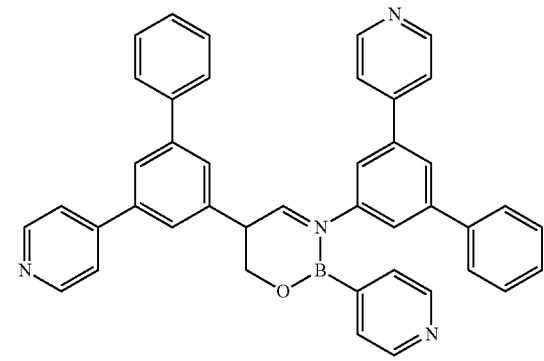
26
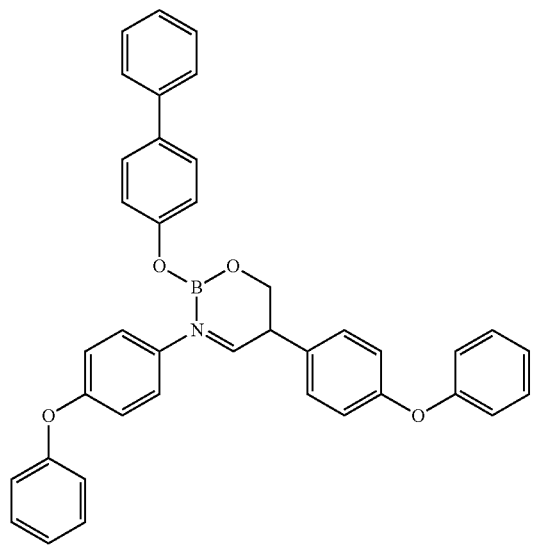
27
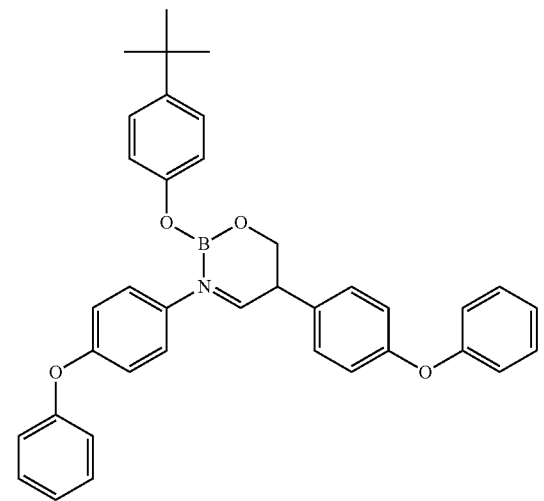
28
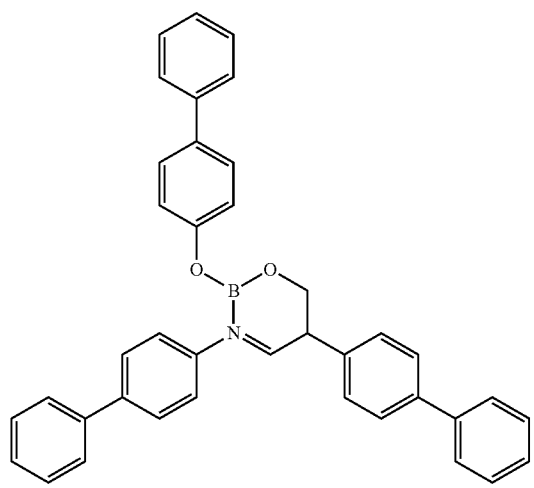
29
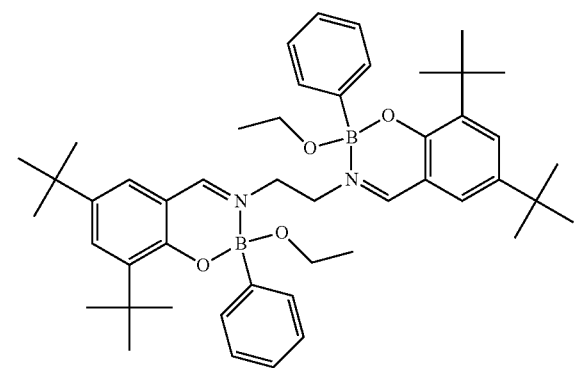
30

-continued
31
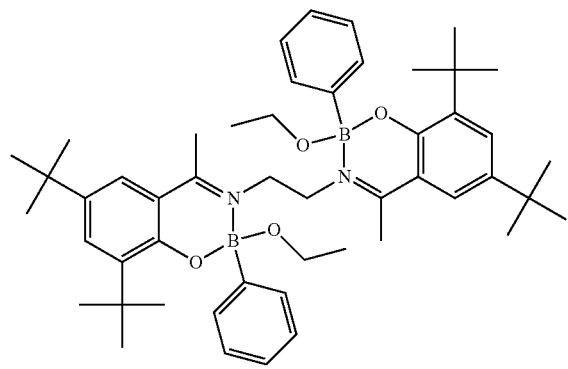
32
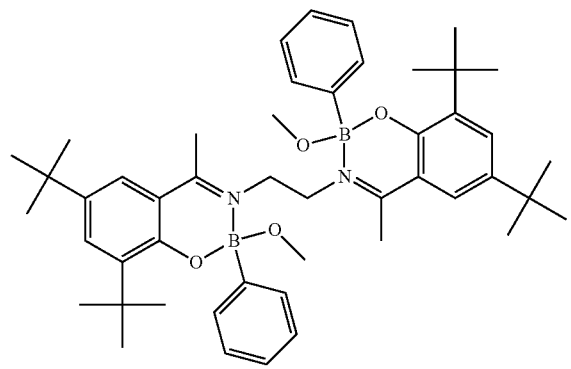
33
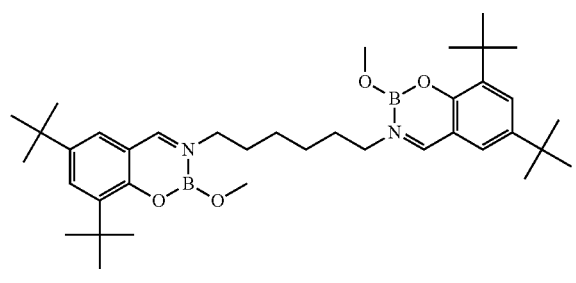
34
35
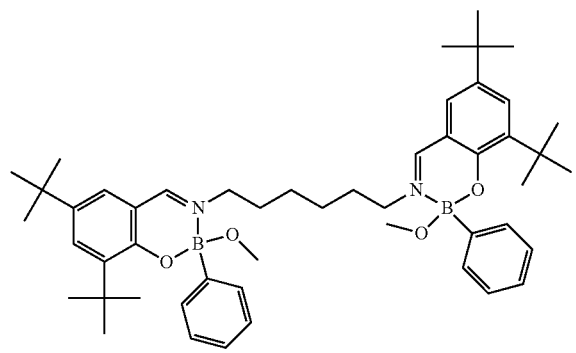
36
37
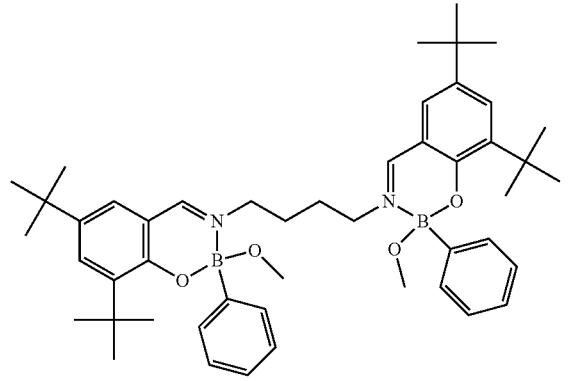
38
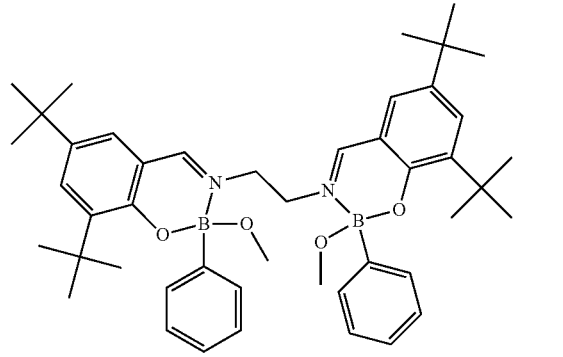

-continued
39
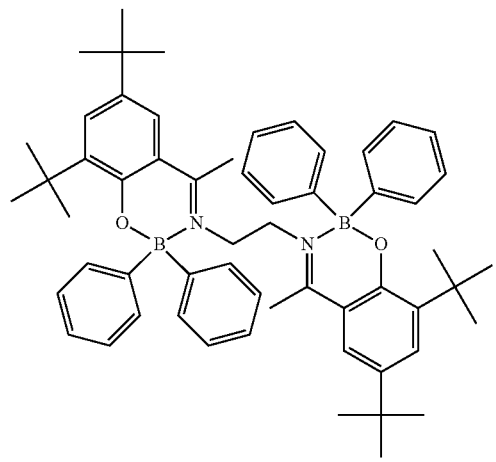
40
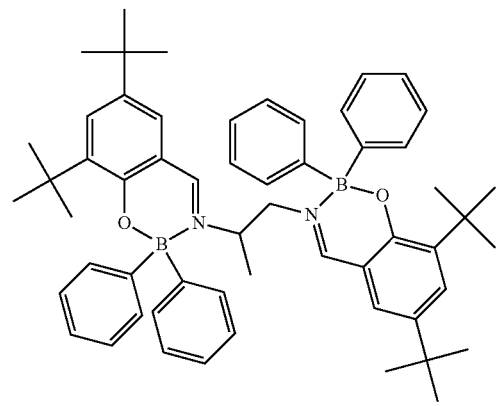
41
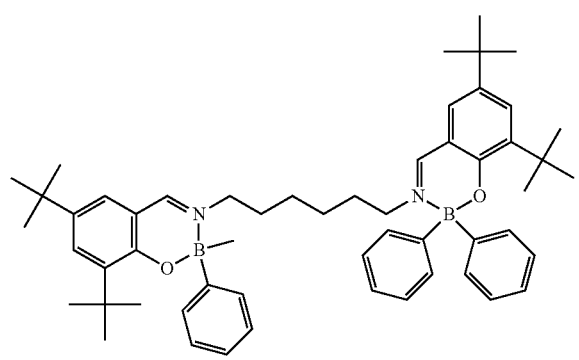
42
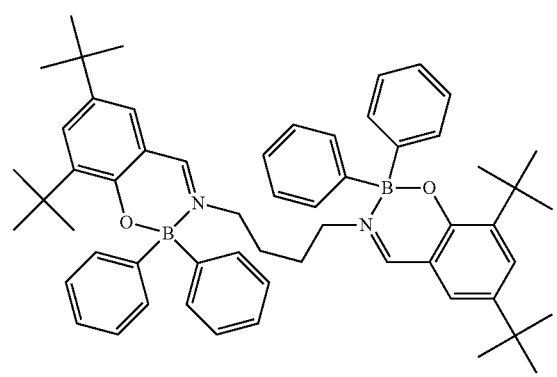
43
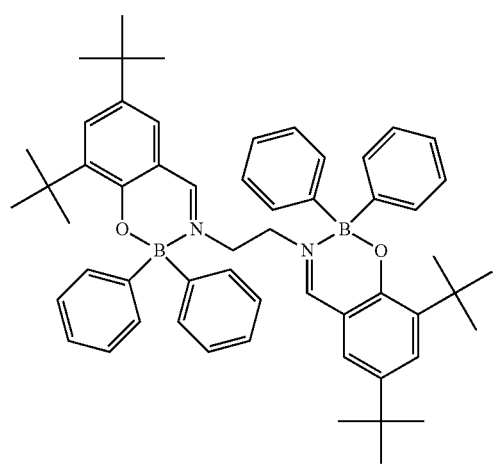
44
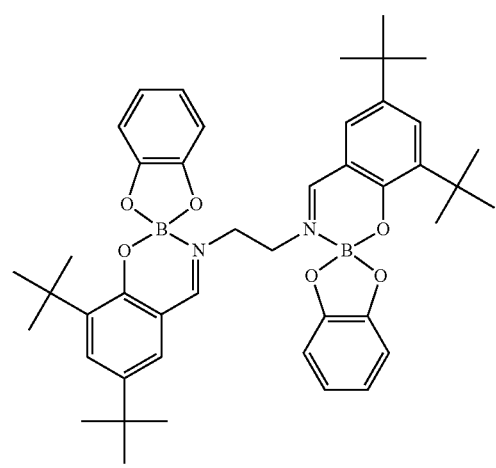
45
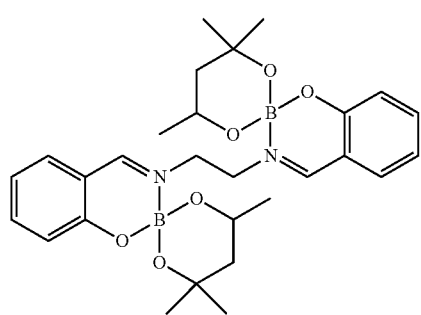
46
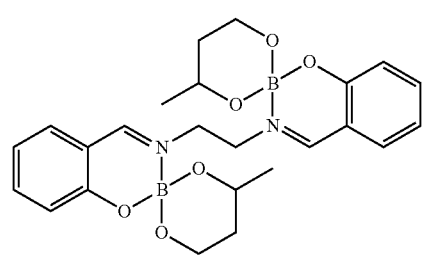

-continued
47
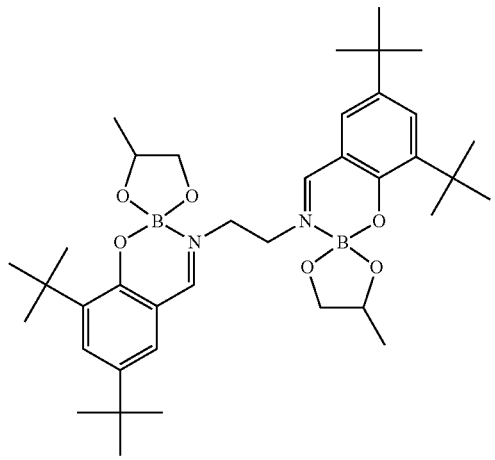
48
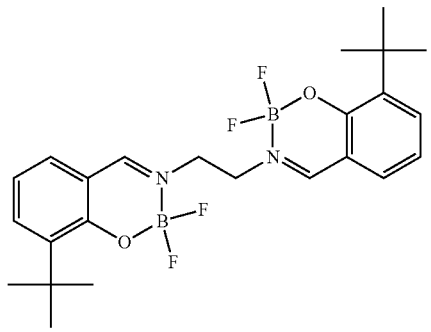
49
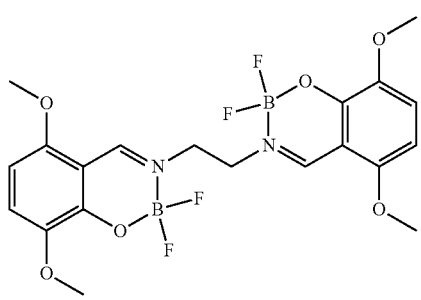
50
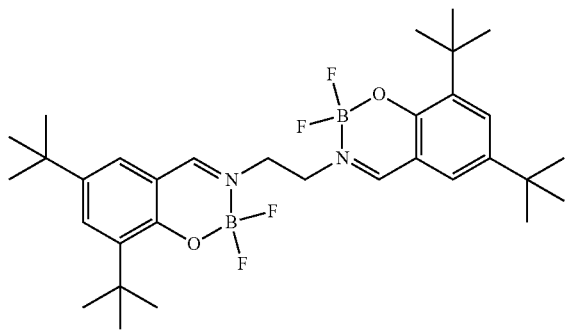
51
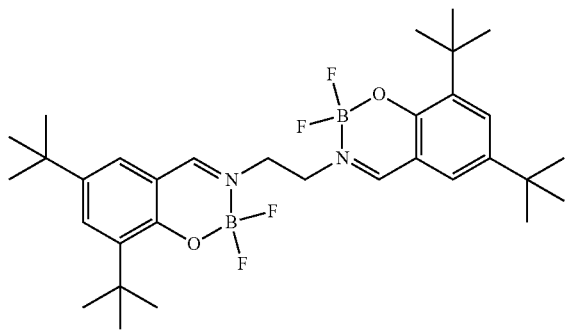
52
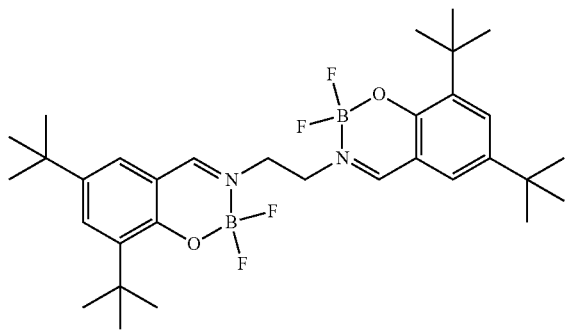
53
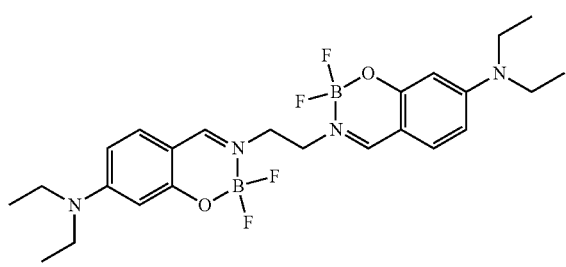
54
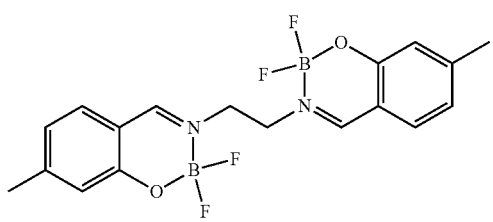

-continued
55
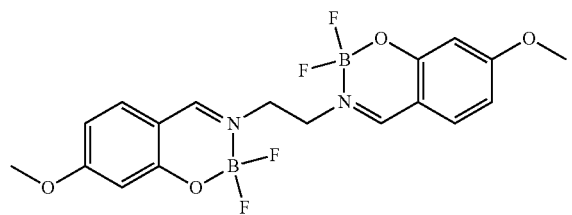
56
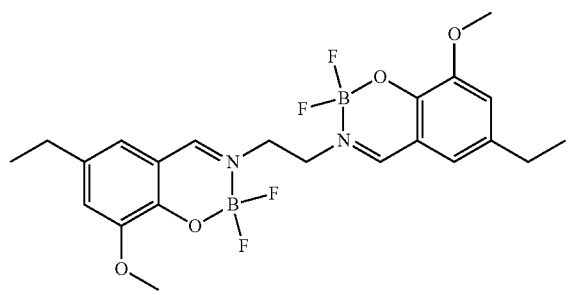
57
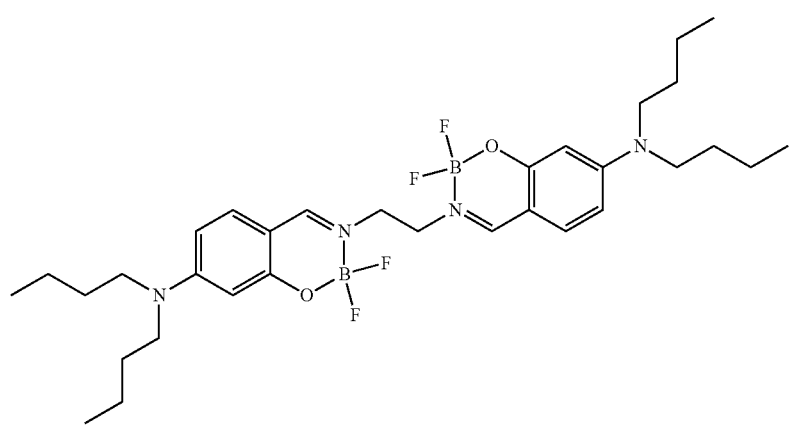
58
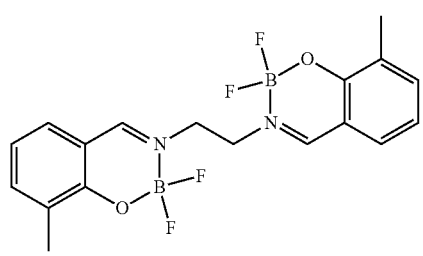
59
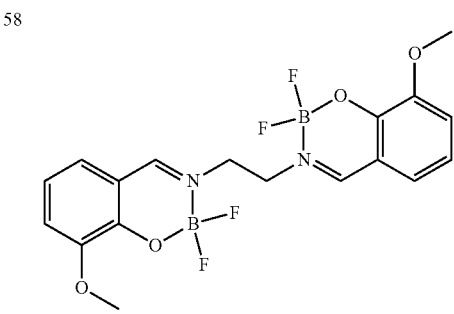
60
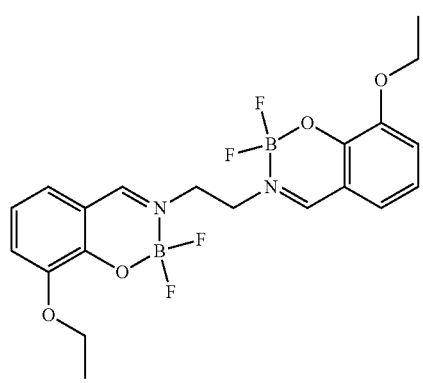
61
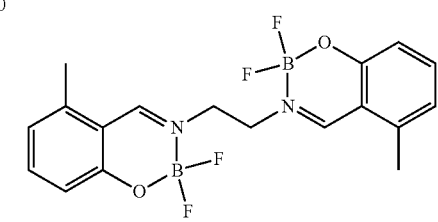
62
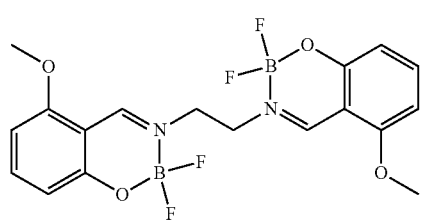
63
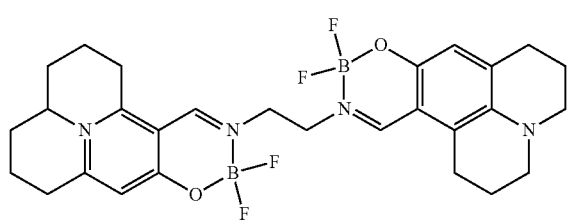

-continued
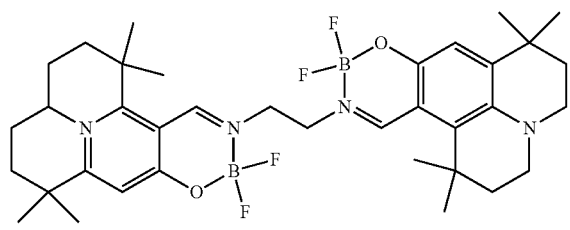
64
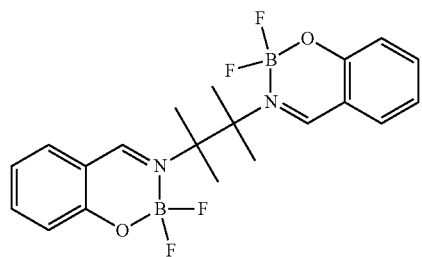
65
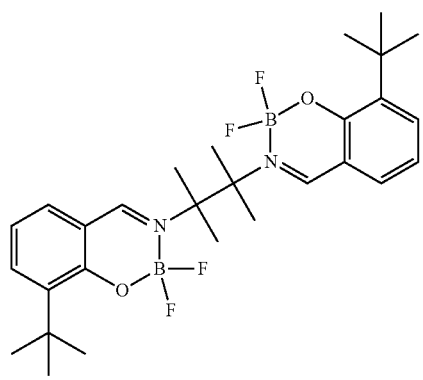
66
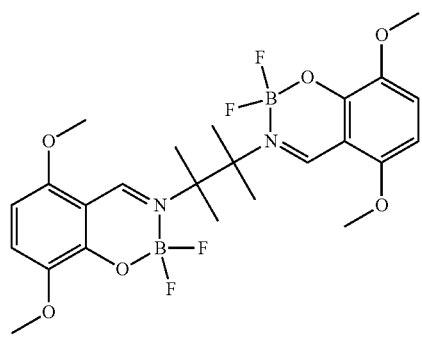
67
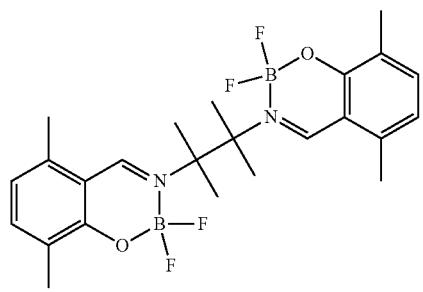
68
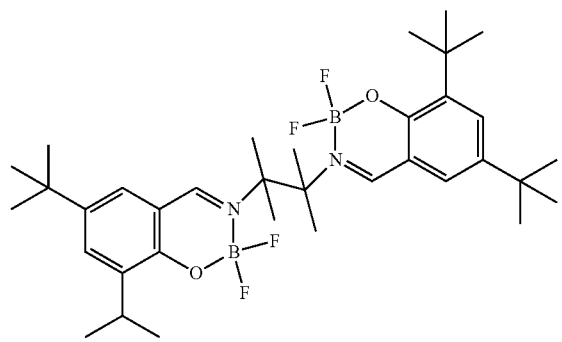
69
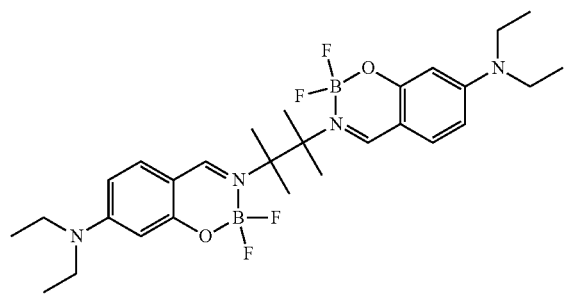
70
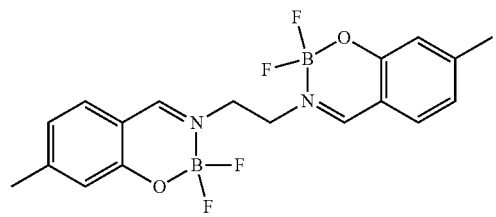
71
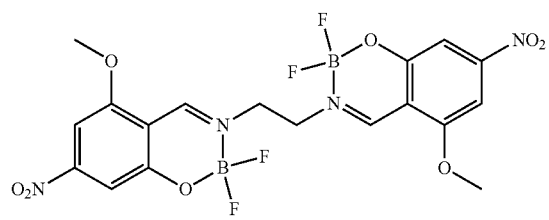
72
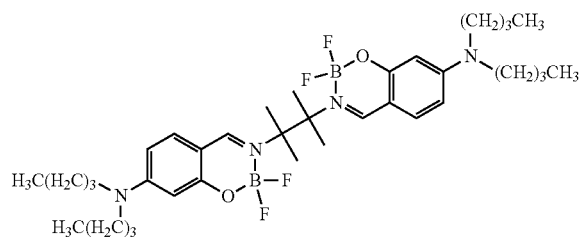
73

-continued
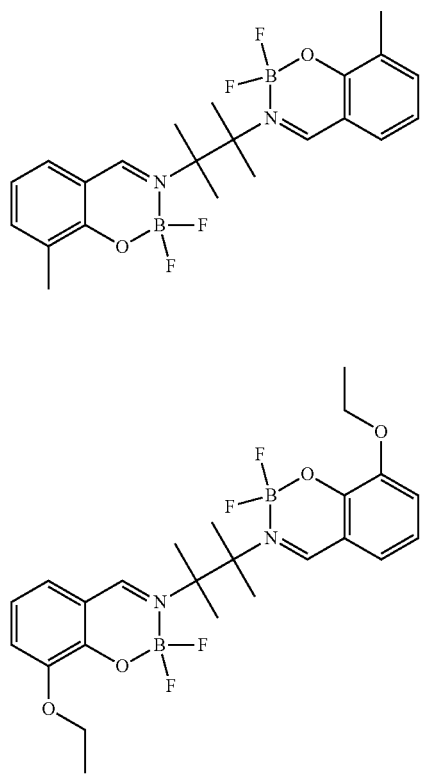
74
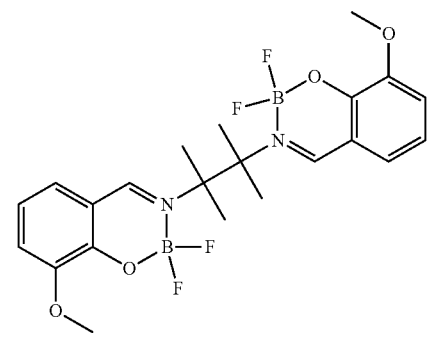
75
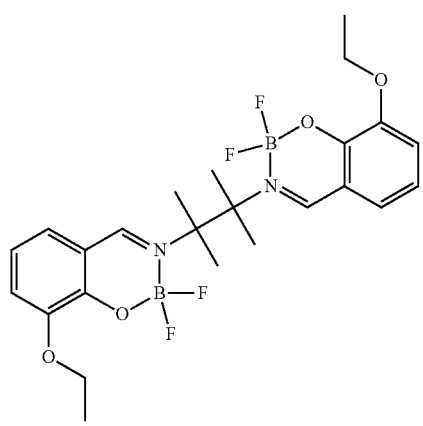
76
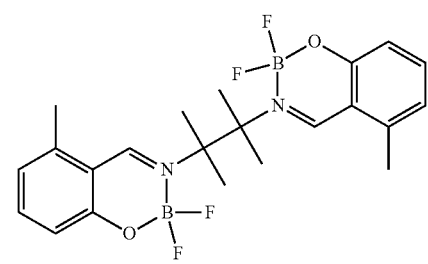
77
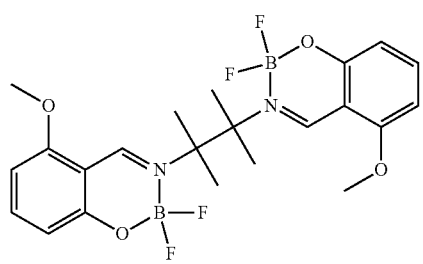
78
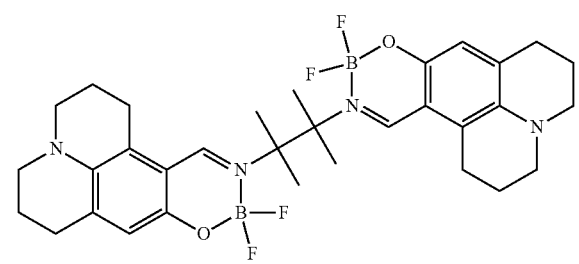
79
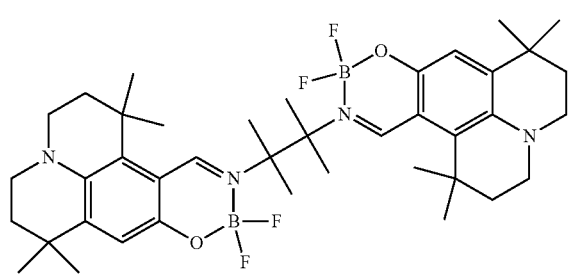
80
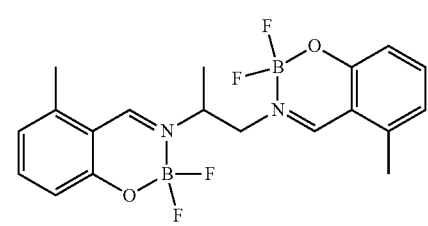
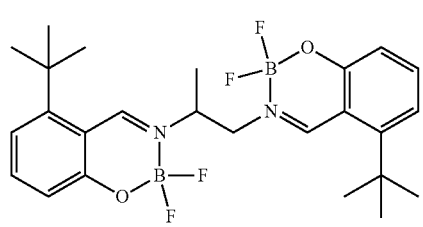
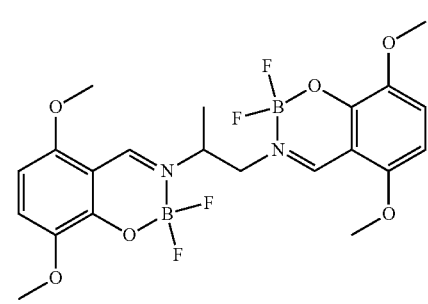
83

84
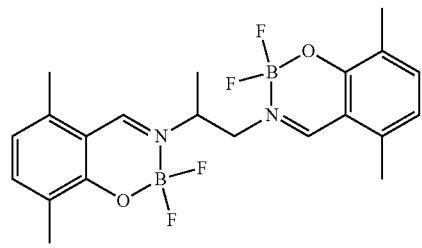
85
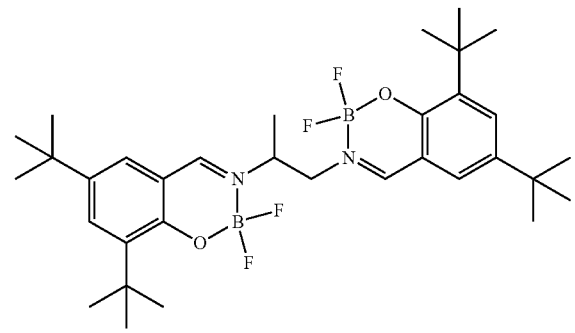
86
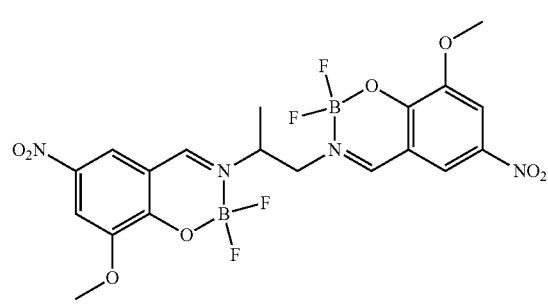
87
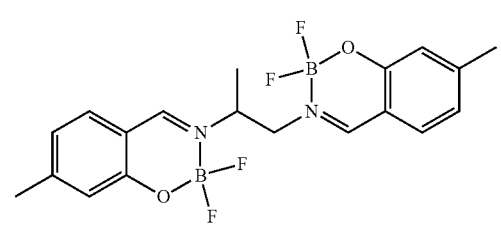
88
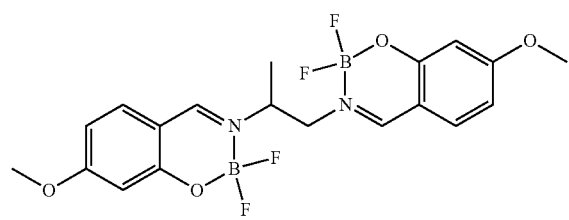
89
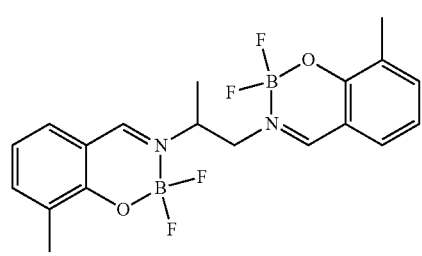
90
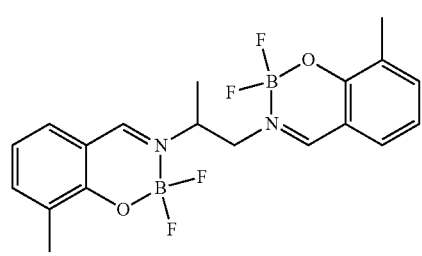
91
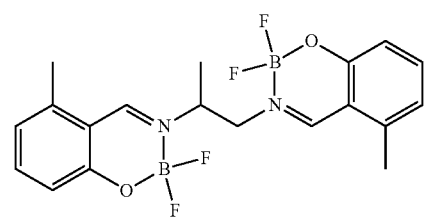
92
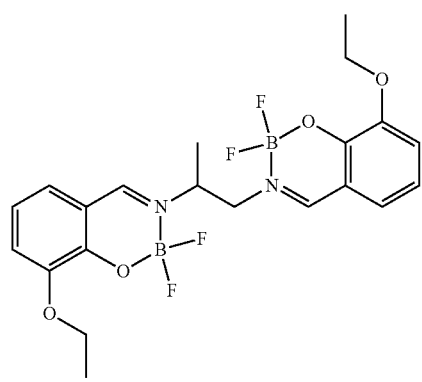
93
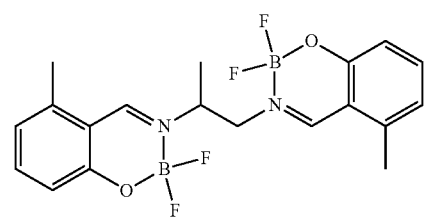

-continued
94 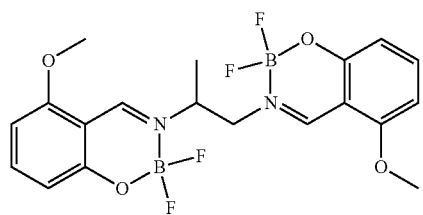
95 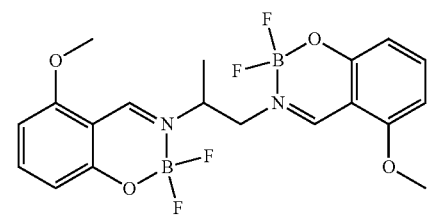
96 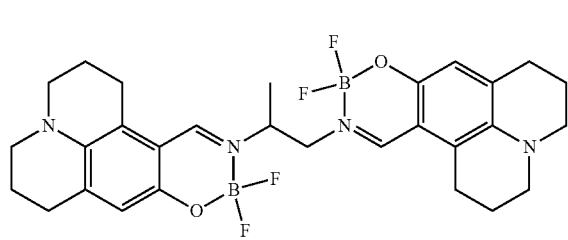
97 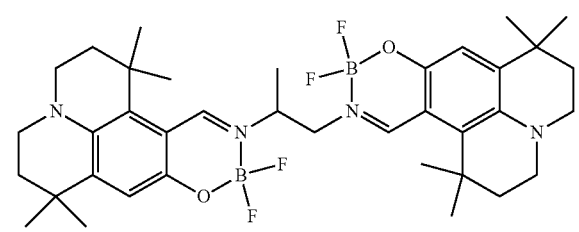
98 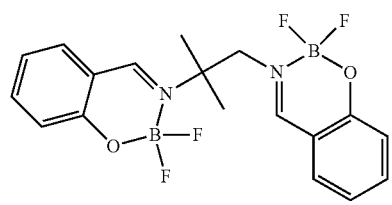
99 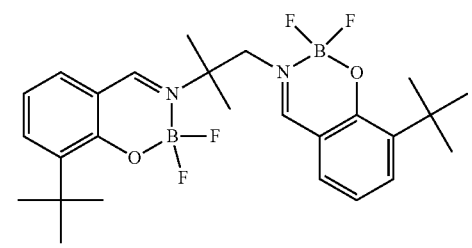
100 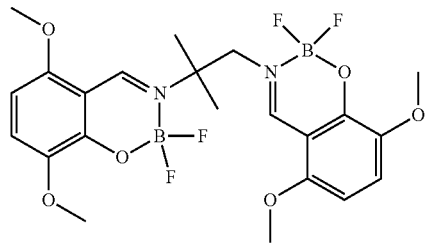
101
102 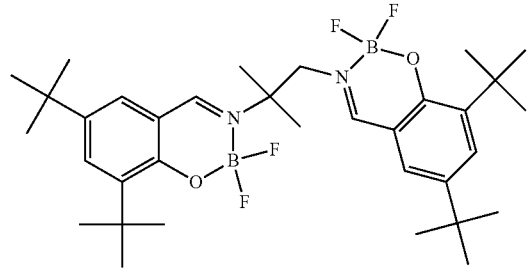
103
104 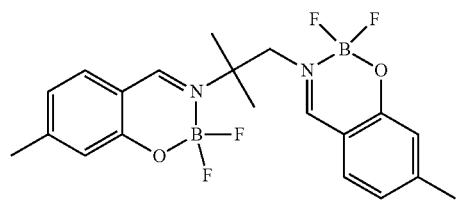
105 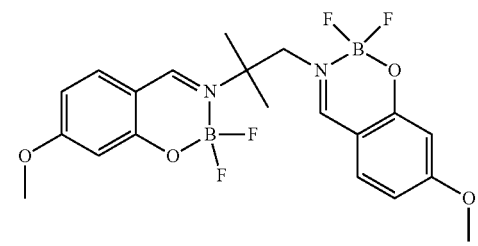

-continued
106 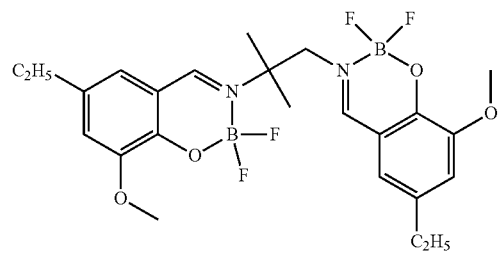
107 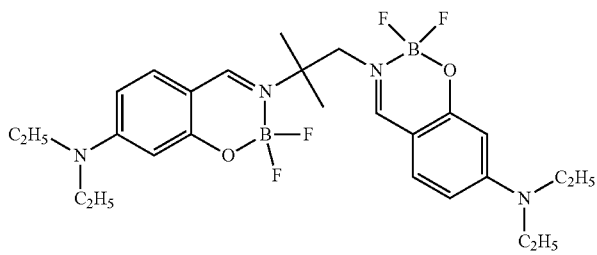
108 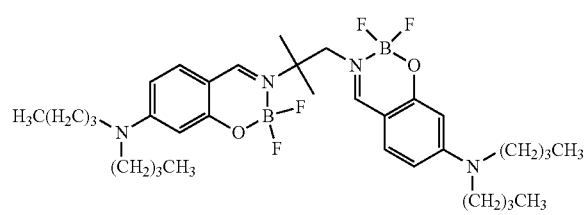
109 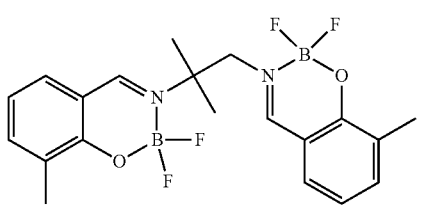
110 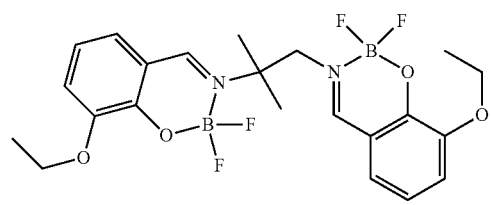
111 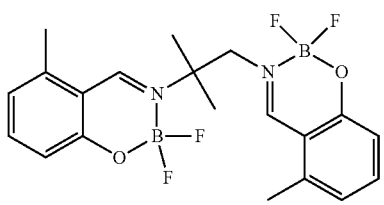
112 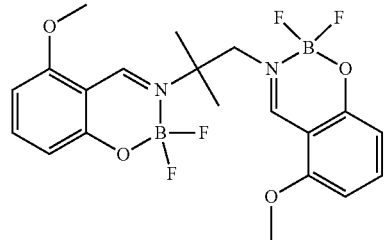
113 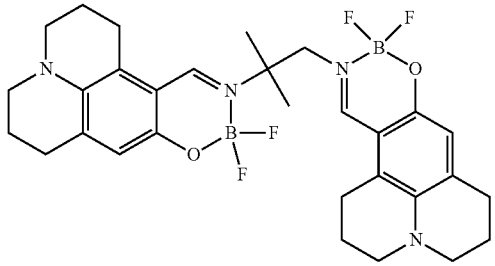
114 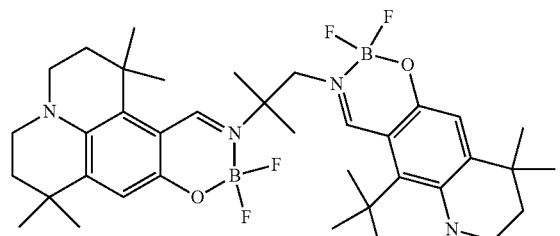
115 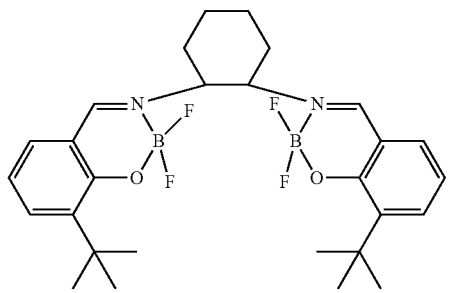
116 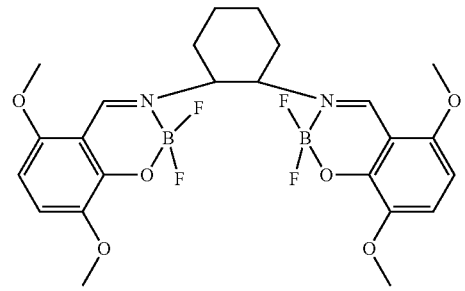
117

-continued
118
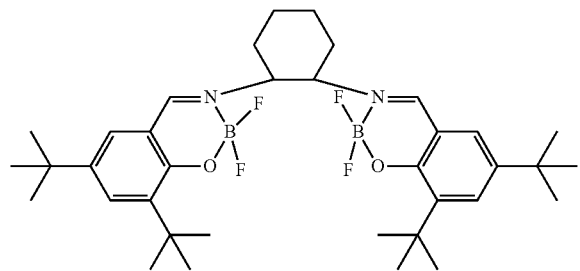
119
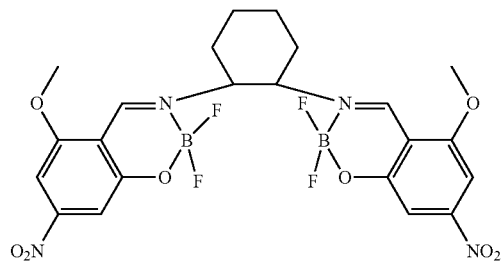
120
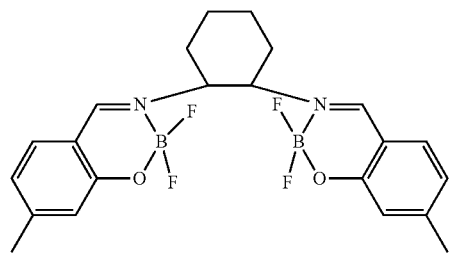
121
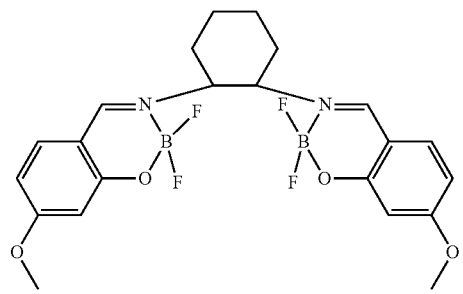
122
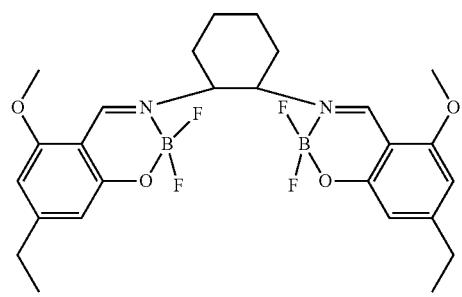
123
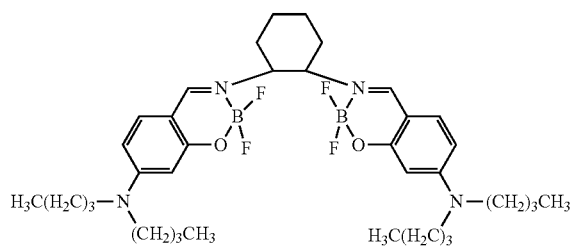
124
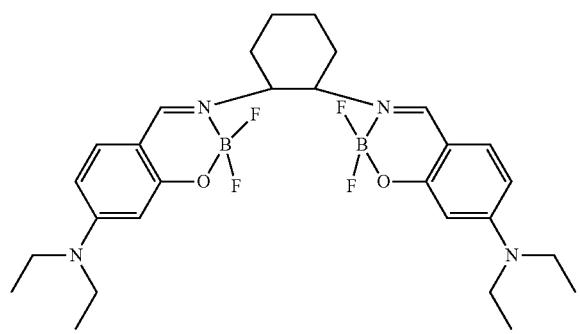
125
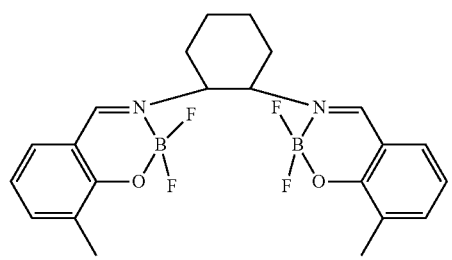
126
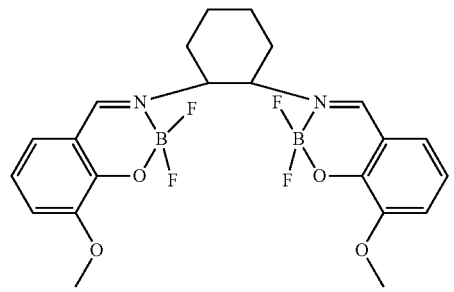
127
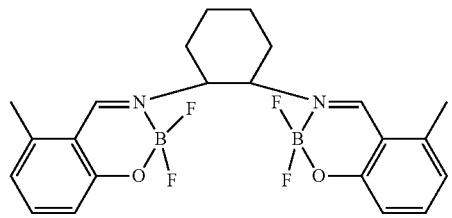

-continued
| 128 | 129 |
|---|---|
| 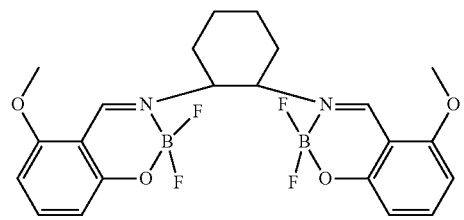 | 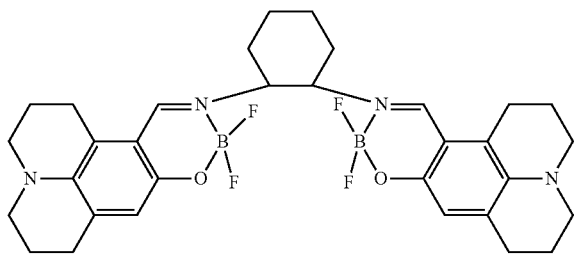 |
| 130 | 131 |
| 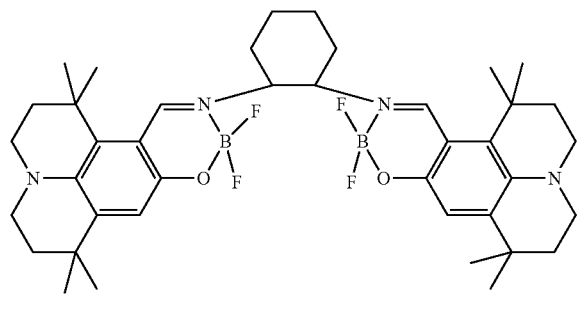 | 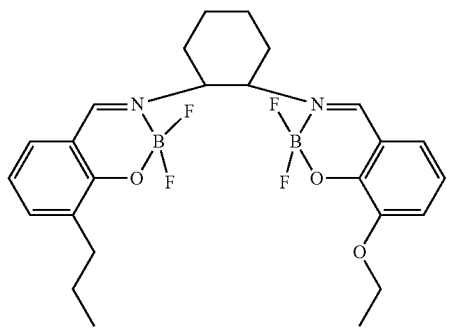 |
| 132 | 133 |
| 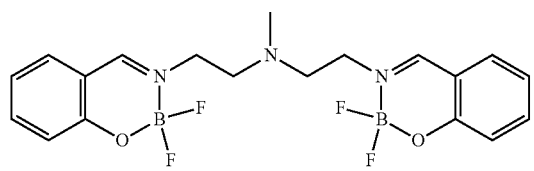 | 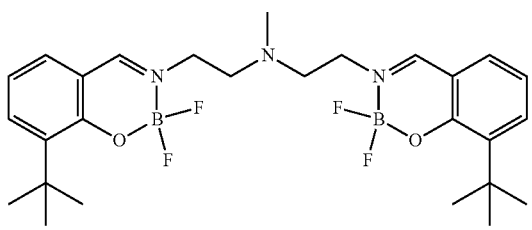 |
| 134 | 135 |
| 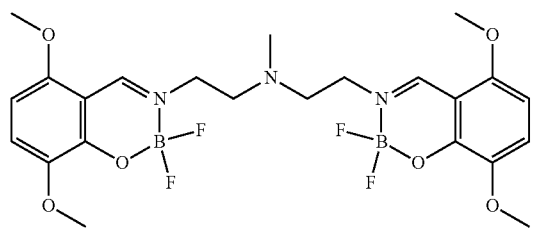 | |
| 136 | 137 |
| 138 | 139 |
| 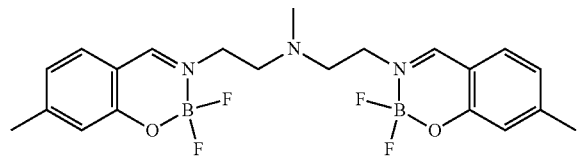 | 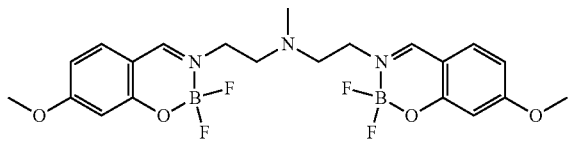 |
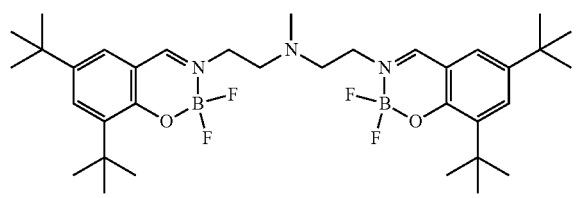

-continued
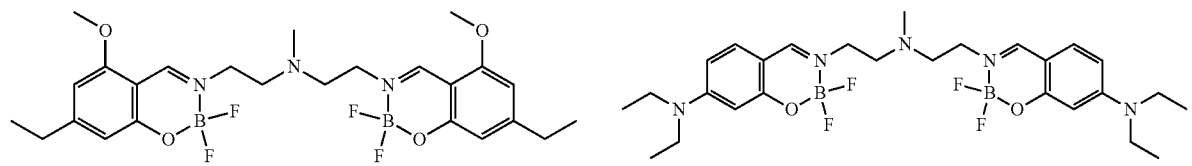
140
141
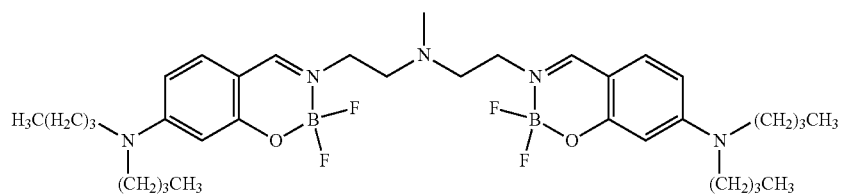
142
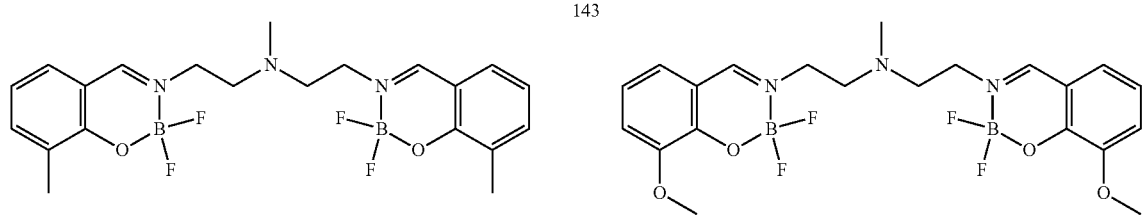
143 144
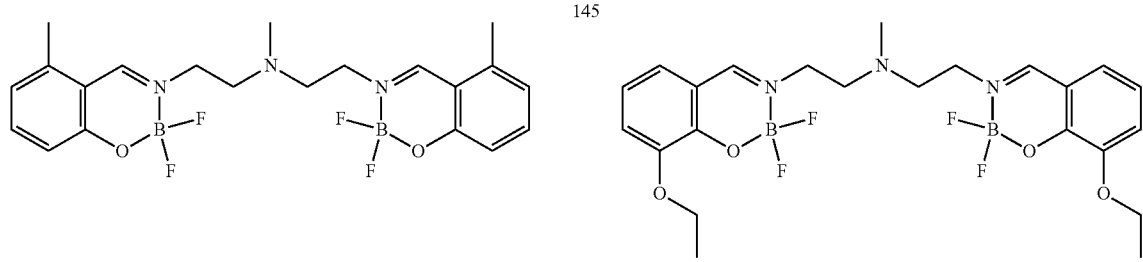
145 146
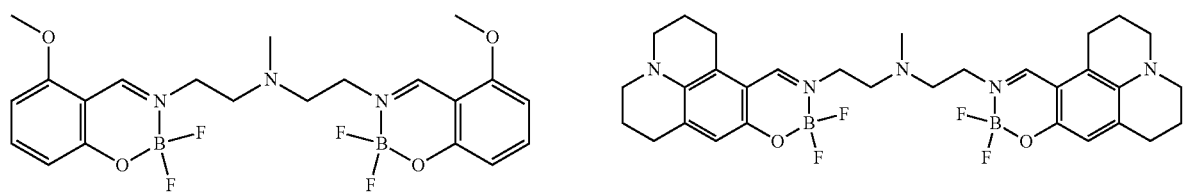
147 148
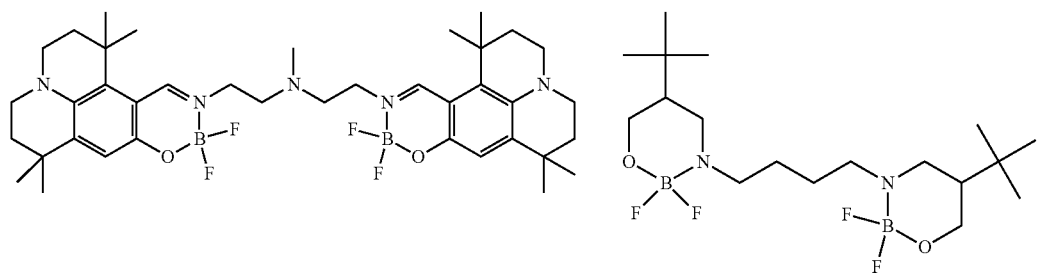
149 150

-continued
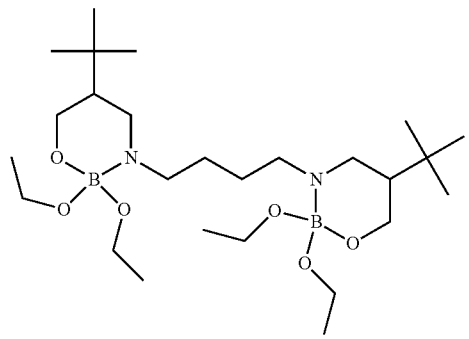
151
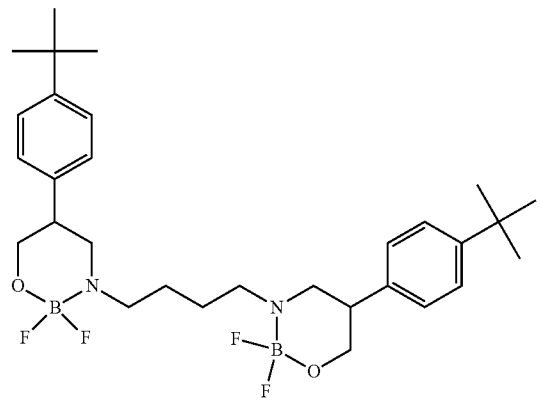
152
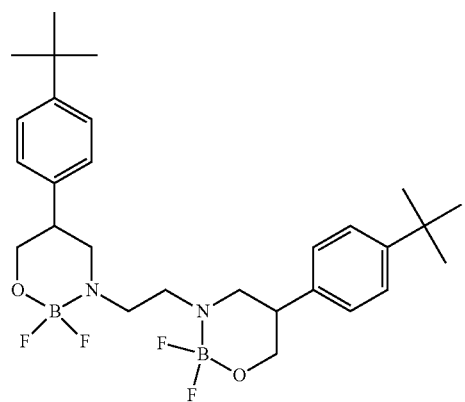
153
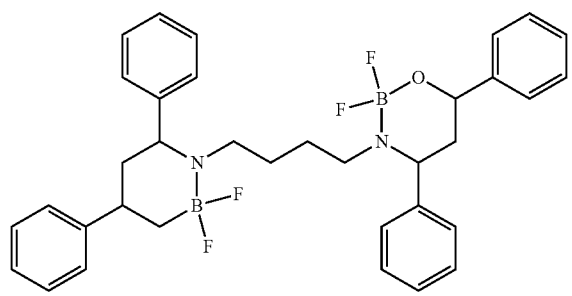
154
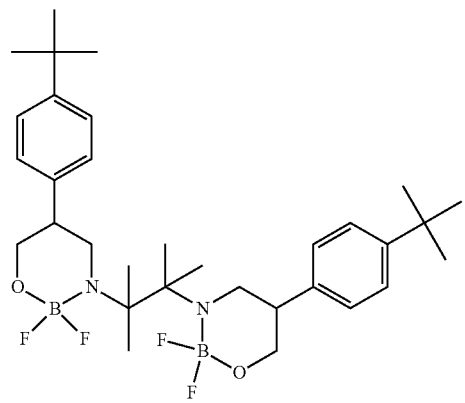
155
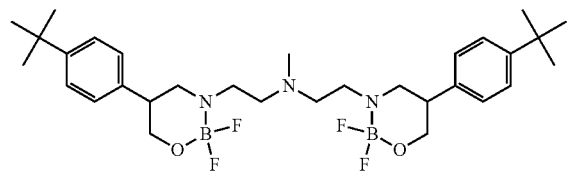
156
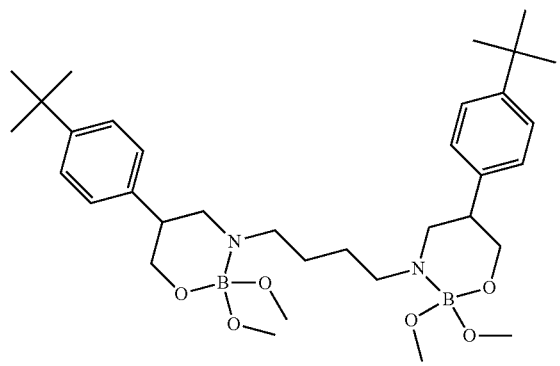
157
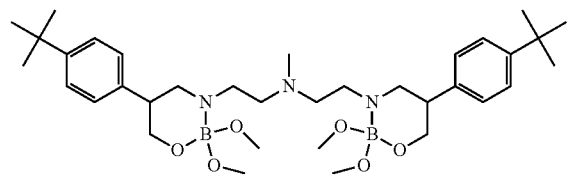
158

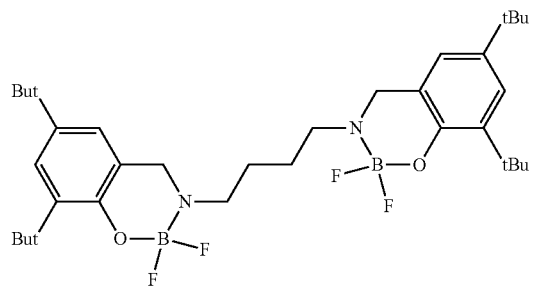

159

The synthesis of the boron complex compounds represented by the said general formulas 1, 2, and 3 can be performed using known methods. For example, the known methods include a reaction of an organoboron reagent and an ethylenediamine (containing salicyl) derivative, but are not intended to be limited.

Embodiments of the organic light-emitting element of the present invention will be specifically described hereinafter. The organic light-emitting element according to an embodiment of the present invention comprises a substrate, a first electrode, more than one organic layer film including a light-emitting layer, a second electrode and a cover layer through which light emitted from the light-emitting layer passes, wherein the light-emitting layer emits light by electric energy.

In the light-emitting element of the present invention, the substrate used is preferably a glass substrate such as soda glass or alkali-free glass. As long as the thickness of the glass substrate is sufficient to maintain the mechanical strength, 0.5 mm or more is sufficient. As for the material of the glass, the less ions eluted from the glass, the better, and therefore, alkali-free glass is preferred. In addition, commercially available glass coated with protective coatings such as $SiO_2$ or the like can also be used. In addition, if the first electrode functions stably, the substrate need not necessarily be glass. For example, an anode may be formed on a plastic substrate.

The material used in the first electrode is preferably a metal such as gold, silver, or aluminum having a high refractive index characteristic, or a metal alloy such as an APC-based alloy. These metals or metal alloys may be laminated in multiple layers. In addition, transparent conductive metal oxides such as tin oxide, indium oxide, indium tin oxide (ITO), and indium zinc oxide (IZO) may be laminated on and/or under the metal, the metal alloy, or a laminate thereof.

The material used in the second electrode is preferably a material that can form a translucent or transparent film through which light can pass. For example, silver, magnesium, aluminum, and calcium, or alloys of these metals, and transparent conductive metal oxides such as tin oxide, indium oxide, indium tin oxide (ITO), or indium zinc oxide (IZO) may be used. These metals, alloys or metal oxides may be laminated in multiple layers.

The method for forming the electrodes may be resistance heating evaporation, electron beam evaporation, sputtering, ion plating, or a glue coating method, and is not particularly limited. In addition, according to a work function of the used material, one of the first electrode and the second electrode functions as an anode with respect to the organic film layer, and the other functions as a cathode.

The organic layer, besides being composed of a light-emitting layer only, may also be of a structure formed by laminating the following layers: 1) a hole transport layer/light-emitting layer; 2) a light-emitting layer/electron transport layer; 3) a hole transport layer/light-emitting layer/electron transport layer; 4) hole injection layer/hole transport layer/light-emitting layer/electron transport layer; or 5) a hole injection layer/hole transport layer/light-emitting layer/electron transport layer/electron injection layer. Furthermore, each of the above-mentioned layers may be any one of a single layer or a plurality of layers. When the structures 1) to 5) are adopted, the anode-side electrode is bonded to the hole input layer or the hole transport layer, and the cathode-side electrode is bonded to the electron input layer or the electron transport layer.

The hole transport layer can be formed by a method of laminating or mixing one or more than two kinds of hole transport materials, or a method using a mixture of a hole transport material and a polymer binder. The hole transport material needs to efficiently transfer holes from the anode between the electrodes to which an electric field is applied. Therefore, it is desirable that the hole injection efficiency is high and the injected holes can be efficiently transported. Therefore, the hole transport material is required to have an appropriate ionic potential, a large hole mobility, and further excellent stability, and is thus not easy to generate impurities that can become traps during manufacture and use. Substances that meet such conditions are not particularly limited. For example, such substances may be benzidines, such as 4,4'-bis(N-(3-methylphenyl)-N-phenylamino) biphenyl (TPD), 4,4'-bis(N-(1-naphthyl)-N-phenylamino) biphenyl (NPD), 4,4'-bis(N, N-bis(4-biphenyl) amino) biphenyl (TBDB), or bis (N,N-diphenyl-4-phenylamino)-N,N-diphenyl-4,4'-diamino-1,1'-biphenyl (TPD232); material groups called star-shaped triarylamine, such as 4,4',4"-tris (3-methylphenyl (phenyl) amino) triphenylamine (m-MTDATA), 4,4',4"-tris (1-naphthyl (phenyl) amino) triphenylamine (1-TNATA); materials having a carbazole skeleton, preferably carbazole-based polymers, specific examples including dicarbazole derivatives, such as bis(N-arylcarbazole) or bis(N-alkylcarbazole), heterocyclic compounds, such as tricarbazole derivatives, tetracarbazole derivatives, triphenyl compounds, pyrazoline derivatives, stilbene compounds, hydrazine compounds, benzofuran derivatives, thiophene derivatives, oxadiazole derivatives, phthalocyanine derivatives and porphyrin derivatives, or fullerene derivatives. In the polymer system, polycarbonates or styrene derivatives, polythiophene, polyaniline, polyfluorene, polyvinylcarbazole, polysilane, and the like containing the above-mentioned monomers in a side chain are also preferred. In addition, inorganic compounds such as P-type Si and P-type SiC can also be used.

The hole injection layer may be provided between the anode and the hole transport layer. By providing the hole injection layer, it can make the organic light-emitting element achieve a low driving voltage and improve the durability. The hole injection layer is generally preferably made of a material having a lower ion potential than the material of the hole transport layer. Specifically, the material of the hole injection layer may be, for example, the aforementioned benzidine derivative such as TPD232, a star-shaped triarylamine material group, or a phthalocyanine derivative, or the like. In addition, it is also preferable that the hole injection layer is composed only of an acceptor compound or that the acceptor compound is doped in other hole transport layers. Examples of the acceptor compound may include: metal chlorides such as ferric trichloride (III), aluminum chloride, gallium chloride, indium chloride and antimony chloride, metal oxides such as molybdenum oxide, vanadium oxide, tungsten oxide and ruthenium oxide, and charge transfer complexes such as tris (4-bromophenyl) ammonium hexachloroantimonate (TBPAH). In addition, the acceptor compound may be organic compounds, quinone-based compounds, acid anhydride-based compounds, fullerene, or the like, which contain nitro group, cyano group, halogen or trifluoromethyl group in the molecules.

In the present invention, the light-emitting layer may be any of a single layer and multiple layers, may be formed from a light-emitting material (a host material and a doping material) respectively, and the light-emitting material may be a mixture of a host material and a doping material, or may be only a host material, either of the above cases being available. That is, in each light-emitting layer of the light-emitting element of the present invention, only the host material or only the doping material may emit light, or the host material and the dopant material may emit light together. From the viewpoint of efficiently utilizing electric energy and obtaining light with high color purity, it is preferable that the light-emitting layer is formed from a mixture of the host material and the doping material. In addition, the host material and the doping material may be a single material, or a combination of a plurality of materials, either of the above cases being available. The doping material may be added to the entire host material, or added to a part of the host material, either of the above cases being available. The doping material may be laminated, or be dispersed, either of the above cases being available. The doping material can control a color of light. When the doping material is excessive, a concentration extinction phenomenon occurs. Therefore, relative to the host material, the amount of the doping material is preferably 20% by weight or less, and more preferably 10% by weight or less. A doping method may be a method of co-evaporation with the host material, or a method of simultaneous evaporation after mixing with the host material in advance.

As the light-emitting material, specifically, fused ring derivatives such as anthracene and pyrene which are conventionally known as light-emitting bodies, metal chelate hydroxyquinoline compounds such as tris (8-hydroxyquinoline) aluminum, dibenzofuran derivatives, carbazole derivatives, indolocarbazole derivatives, and polyphenylene vinylene derivatives, polyparaphenylene derivatives, and polythiophene derivatives in polymers, etc., can be used, and are not particularly limited.

The host material contained in the light-emitting material is not particularly limited. Compounds having a fused aromatic ring or derivatives thereof of anthracene, phenanthrene, pyrene, benzophenanthrene, tetracene, perylene, benzo [9,10] phenanthrene, fluoranthene, fluorene, indene, aromatic amine derivatives such as N, N'-dinaphthyl-N, N'-diphenyl-4,4'-diphenyl-1,1'-diamine, metal chelate hydroxyquinoline compounds such as tris (8-hydroxyquinoline) aluminum, pyrrolopyrrole derivatives, dibenzofuran derivatives, carbazole derivatives, indolocarbazole derivatives, and triazine derivatives can be used. In the polymers, polyphenylene vinylene derivatives, polyparaphenylene derivatives, polyfluorene derivatives, polyvinylcarbazole derivatives, polythiophene derivatives, or the like may be used, and will not be particularly limited.

In addition, the doping material is not particularly limited. Examples of the doping material may include: compounds having a fused aromatic ring or derivatives thereof (such as 2-(benzothiazole-2-yl)-9,10-diphenylanthracene) of naphthalene, anthracene, phenanthrene, pyrene, benzophenanthrene, perylene, benzo [9,10] phenanthrene, fluoranthene, fluorene and indene; heteroaromatic ring-containing compounds or derivatives thereof such as furan, pyrrole, thiophene, silole, 9-silafluorene, 9,9'-spirobisilafluorene, benzothiophene, benzofuran, indole, dibenzothiophene, dibenzofuran, imidazopyridine, phenanthroline, pyridine, pyrazine, naphthyridine, quinoxaline, pyrrolopyridine and thioxanthene; borane derivatives, distyrylbenzene derivatives, aminostyryl derivatives, pyrromethene derivatives, diketopyrrolo [3,4-c]pyrrole derivatives, coumarin derivatives; azole derivatives such as imidazole, thiazole, thiadiazole, carbazole, oxazole, oxadiazole and triazole; and aromatic amine derivatives, and the like.

In addition, the light-emitting layer may be doped with a phosphorescent light-emitting material. The phosphorescent light-emitting material is a material that can phosphorescently emit light at room temperature. When the phosphorescent light-emitting material is used as a dopant, it is required to be capable of phosphorescently emitting light substantially at room temperature, but not be particularly limited. The phosphorescent light-emitting material is preferably an organometallic complex compound containing at least one metal selected from the group consisting of indium, ruthenium, rhodium, palladium, platinum, osmium, and rhenium. From the viewpoint of having high phosphorescent luminous efficiency at room temperature, an organic metal complex containing indium or platinum is more preferable. As a host material used in combination with the phosphorescent dopant, indole derivatives, carbazole derivatives, indolocarbazole derivatives, nitrogen-containing aromatic compound derivatives having pyridine, pyrimidine, triazine skeletons; aromatic hydrocarbon compound derivatives such as polyarylbenzene derivatives, spirofluorene derivatives, truxene and benzo [9,10] phenanthrene; compounds containing oxygen elements such as dibenzofuran derivatives and dibenzothiophene, organometallic complexes such as hydroxyquinoline beryllium complexes can be used well. However, it is basically not particularly limited as long as the triplet energy of a material is larger than that of the dopant used, and electrons and holes can be smoothly injected or transported from the respective transport layers. In addition, two or more triplet light-emitting dopants may be contained, and two or more host materials may also be contained. In addition, one or more triplet light-emitting dopants and one or more fluorescent light-emitting dopants may also be contained.

In the present invention, the electron transport layer is a layer in which electrons are injected from the cathode and then the electrons are transported. The electron transport layer should preferably have high electron injection efficiency and can efficiently transport the injected electrons. Therefore, the electron transport layer is preferably composed of a substance which has large electron affinity and electron mobility, excellent stability, and is less likely to generate impurities that can become traps during manufacture and use. However, in consideration of the transport equilibrium of holes and electrons, if the electron transport layer mainly plays a role that can efficiently prevent holes from the anode from flowing to the cathode side without being combined, even if the electron transport layer is composed of a material having less electron transport capability, the effect of improving the luminous efficiency is equivalent to that of a case in which the electron transport layer is composed of a material having high electron transport capability. Therefore, in the electron transport layer of the present invention, a hole barrier layer that can efficiently prevent hole migration is included as an equivalent.

The electron transport material used in the electron transport layer is not particularly limited. Examples of the electron transport material may include: fused aromatic ring derivatives, such as naphthalene and anthracene; styryl-based aromatic ring derivatives represented by 4,4'-bis(diphenylvinyl) biphenyl; quinone derivatives such as anthraquinone and biphenylquinone; phosphine oxide derivatives; hydroxyquinoline complexes such as tris (8-hydroxyquinoline) aluminum; benzohydroxyquinoline complex, hydroxylazole complex, azomethine complex, tropolone metal complex or flavonol metal complex. It is preferable to use a compound having a heteroaromatic ring structure from the viewpoint of reducing the driving voltage and obtaining high-efficiency light emission. The heteroaromatic ring structure is composed of elements selected from carbon, hydrogen, nitrogen, oxygen, silicon, and phosphorus and contains electron-withdrawing nitrogen.

Heteroaromatic rings containing electron-withdrawing nitrogen have high electrophilicity. The electron transport material containing electron-withdrawing nitrogen easily accepts electrons from a cathode having high electrophilicity, and thus can reduce the driving voltage of the light-emitting element. In addition, since the supply of electrons to the light-emitting layer rises and the probability of recombination in the light-emitting layer increases, the luminous efficiency is improved. Examples of the heteroaromatic ring containing electron-withdrawing nitrogen include, for example: a pyridine ring, a pyrazine ring, a pyrimidine ring, a quinoline ring, a quinoxaline ring, a naphthyridine ring, a pyrimidopyrimidinering, a benzoquinoline ring, a phenanthroline ring, an imidazole ring, an oxazole ring, an oxadiazole ring, a triazole ring, a thiazole ring, a thiadiazole ring, a benzoxazole ring, a benzothiazole ring, a benzimidazole ring, a phenanthroimidazole ring, or the like.

In addition, examples of the compounds having these heteroaromatic ring structures include, for example: benzimidazole derivatives, benzoxazole derivatives benzothiazole derivatives, oxadiazole derivatives, thiadiazole derivatives, triazole derivatives, pyrazine derivatives, phenanthroline derivatives, quinoxaline derivatives, quinoline derivatives, benzoquinoline derivatives, and other oligopyridine derivatives such as dipyridyl, terpyridine. When the above derivatives have a fused aromatic ring skeleton, the glass transition temperature is increased, and the electron mobility is improved. Therefore, the effect of reducing the driving voltage of the light-emitting element is improved, which is thus preferable. In addition, from the viewpoint of improving durability of the light-emitting device, easy synthesis, and easy purchase of raw materials, it is preferred that the fused aromatic ring skeleton is an anthracene skeleton, a pyrene skeleton, or a phenanthroline skeleton.

The above-mentioned electron transport material may be used alone, or two or more kinds of the above-mentioned electron transport materials may be used in combination, or one or more other electron transport materials may be mixed into the above-mentioned electron transport materials. In addition, a donor compound may be added. Here, the donor compound refers to a compound that improves an electron injection energy barrier so that electrons can be easily injected from the cathode or the electron injection layer into the electron transport layer, thereby improving the electrical conductivity of the electron transport layer. Preferred examples of the donor compound of the present invention include: alkali metals, inorganic salts containing alkali metals, a complex of alkali metals and organic substances, alkaline earth metal, inorganic salts containing alkaline earth metal, or a complex of alkaline earth metals and organic substances. Preferred examples of the alkali metals or alkaline earth metals include: alkali metals such as lithium, sodium or cesium, or alkaline earth metals such as magnesium or calcium, which have a low work function and have a significant effect of improving the electron transport ability.

In the present invention, an electron injection layer may be provided between the cathode and the electron transport layer. Generally, the electron injection layer is inserted to help inject electrons from the cathode to the electron transport layer. During insertion, a compound containing electron-withdrawing nitrogen and having a heteroaromatic ring structure or a layer containing the above-mentioned donor compound may be used. In addition, in the electron injection layer, an insulator or a semiconductor inorganic substance may be used. These materials are preferable because they can effectively prevent short-circuiting of the light-emitting element and improve the electron injection properties. As these insulators, at least one metal compound selected from the group consisting of alkali metal chalcogenides, alkaline earth metal chalcogenides, alkali metal halides, and alkaline earth metal halides is preferably used. In addition, a complex of organic substances and metals can also be used well.

Examples of the method for forming the above-mentioned layers constituting the light-emitting element include: resistance heating evaporation, electron beam evaporation, sputtering, molecular lamination, or coating methods, and are not particularly limited. However, in general, from the viewpoint of element characteristics, resistance heating evaporation or electron beam evaporation is preferred.

The thickness of the organic layer varies depending on the resistance value of the light-emitting substance and cannot be limited, but is preferably 1 to 1000 nm. The film thicknesses of the light-emitting layer, the electron transport layer, and the hole transport layer are preferably 1 nm to 200 nm, and more preferably 5 nm to 100 nm, respectively.

The cover layer of the present invention can achieve high luminous efficiency by containing the above-mentioned boron complex compound. The boron complex compound has a low refractive index because it has an alkylene linkage and a fluorine element. Furthermore, because the boron complex compound has excellent film-forming properties of an evaporated thin film, it has a stable refractive index and attenuation coefficient regardless of various bottom layers such as glass and metal. When a bottom layer of a material with low film-forming properties of the evaporated thin film changes, the refractive index and the attenuation coefficient also tend to change greatly. In order to maximize the luminous efficiency and achieve color reproducibility, it is preferable to laminate the boron-containing complex compounds at a thickness of 20 nm to 120 nm. More preferably, the laminating thickness is 40 nm to 80 nm. In addition, from the viewpoint of maximizing the luminous efficiency, the laminating thickness is more preferably 50 nm to 70 nm.

The method for forming the cover layer is not particularly limited, and examples thereof include resistance heating evaporation, electron beam evaporation, sputtering, molecular lamination method, coating method, inkjet method, doctor blade method, and laser transfer printing method.

The light-emitting element of the present invention has a function of converting electric energy into light. Here, as the electric energy, a direct current is mainly used, but a pulse current or an alternating current may also be available. The current and voltage values are not particularly limited, but when considering the power consumption and life of the element, it should be selected in such a way that the maximum brightness can be obtained with the lowest possible energy.

For example, the light-emitting element of the present invention can be well used as a flat panel display that displays in a mode of matrixes and/or fields.

The matrix mode means that the pixels used for display are arranged in a two-dimensional manner such as grids or mosaic, and a set of pixels is used to display texts or images. The shape and size of the pixels depend on the applications. For example, in the image and text display of computers, monitors, and televisions, quadrilateral pixels with a side length less than 300 µm are usually used. In addition, in the case of a large-sized display such as a display panel, pixels having a side length of mm-scale are used. In the case of monochrome display, it is only necessary to arrange pixels of the same color, but in the case of color display, red, green, and blue pixels are arranged for display. In this case, a triangle type and a stripe type are typical. Moreover, a driving method for the matrixes may be any one of a line-by-line driving method and an active matrix. Although the line-by-line driving method has a simple structure, there may be cases where the active matrix is excellent when considering the operation characteristics. Therefore, it needs to be flexibly used according to applications.

The field mode in the present invention refers to a mode in which a pattern is formed, and an area determined by the configuration of the pattern emits light to display predetermined information. Examples may include: time and temperature display in digital clocks and thermometers, display of working states of audio equipment, electromagnetic cookers, etc., and panel display of automobiles. Moreover, the matrix display and the field display may coexist in the same panel.

The light-emitting element of the present invention is preferably used as an illumination light source, and can provide a light source that is thinner and lighter than existing light sources and that can perform surface light-emission.

DETAILED DESCRIPTION OF EMBODIMENTS OF THE INVENTION

The present invention will be illustrated by the following examples, but the present invention is not limited to the boron complex compounds and synthesis methods exemplified in these examples.

Without specification, the materials and methods used in the examples and comparative examples are obtained or used as generally known to those skilled in the art.

Toluene, N, N-diisopropylethylamine, dichloromethane, and sodium carbonate 3,5-di-tert-butyl salicylaldehyde, boron trifluoride diethyl etherate, etc. used in the examples and comparative examples are purchased from Sinopharm;

$^1$H-NMR spectrum is measured using a JEOL (400 MHz) nuclear magnetic resonance instrument; HPLC spectrum is measured using a Shimadzu LC-20AD high-performance liquid chromatograph.

The following compounds are synthesized and/or used in the examples and comparative examples:

Compound [10]: B-biphenyl-N-biphenyl-3-biphenyl-2-aza6-oxaborolan

Compound [51]: [[[2,2'-[1,2-ethylenedi[(trivalent nitrogen)methine]]bis[4,6-bis(tert-butyl)phenol]](2-)]]tetrafluorodiboron Compound [53]: [[[2,2'-[1,2-ethylenedi[(trivalent nitrogen)methine]]bis[5-N,N'-diethylaminephenol]](2-)]]tetrafluorodiboron Compound [55]: [[[2,2'-[1,2-ethylenedi[(trivalent nitrogen)methine]]bis[5-methoxyphenol]](2-)]]tetrafluorodiboron Compound [69]: [[[2,2'-[1,2-ethylenedi[(trivalent nitrogen)dimethylenemethine]]]bis[4,6-bis(tert-butyl) phenol]](2-)]]tetramethoxydiboron Compound [70]: [[[2,2'-[1,2-ethylenedi[(trivalent nitrogen)dimethylenemethine]]]bis[5-N, N'-diethylaminephenol]](2-)]] tetrafluorodiboron Compound [118]: [[[2,2'-[1,2-bis(trivalent nitrogen) cyclohexyl]bis[4,6-bis(tert-butyl)phenol]](2-)]]tetrafluorodiboron Compound [124]: [[[2,2'-[1,2-bis(trivalent nitrogen) cyclohexyl]bis[5-N,N'-diethylaminephenol]](2-)]]tetrafluorodiboron Compound [136]: [[[2,2'-2-[1-ethylenedi[(trivalent nitrogen)ethylidene]methylamine]bis[4,6-bis(tert-butyl) phenol]](2-)]]tetrafluorodiboron Compound [141]: [[[2,2'-2-[1-ethylenedi[(trivalent nitrogen)ethylidene]methylamine]bis[diethylaminephenol]] (2-)]]tetrafluorodiboron Compound [154]: 3,3'-(1,4-butanediyl)di[3-, 5-bis (phenyl)-3,4-dihydro-2-difluoro 3-aza-6oxa-cyclohexylborane Compound [159]: [[[2,2'-[1,2-butanediol[(trivalent nitrogen)methine]]bis[4,6-bis (tert-butyl)phenol]](2-)]]tetrafluorodiboron Compound [160]: 3,3'-(1,4-butanediyl)-N, N'-phenyl-difluoro 3,6-aza-cyclohexylborane

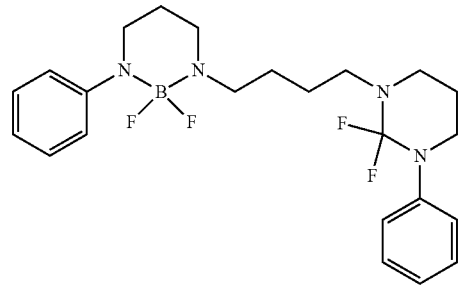

The following compounds are used in the examples and comparative examples:

BF3.Et2O: boron trifluoride ether complex

DIEA: N,N-diisopropylethylamine

NPD: (N,N'-diphenyl-N,N'-di(1-naphthyl)-1,1'-biphenyl-4,4'-diamine)

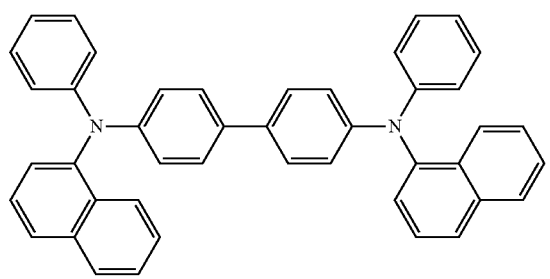 [SMILES: c1ccc(N(c2ccc(-c3ccc(N(c4ccccc4)c4cccc5ccccc45)cc3)cc2)c2cccc3ccccc23)cc1]

F4-TCNQ (2,3,5,6-tetrafluoro-7,7', 8,8'-tetracyanodimethyl p-benzoquinone)

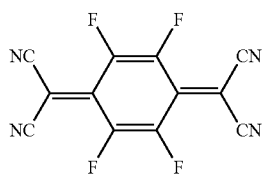

BH: (9-(2-naphthyl)-10-(4-(1-naphthyl)phenyl) anthracene)

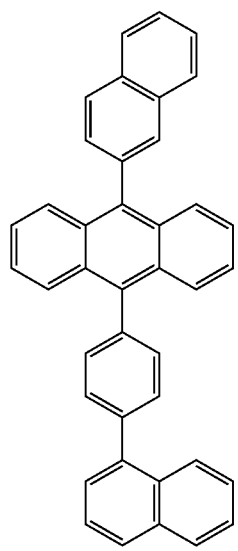 [SMILES: c1ccc2cc(-c3c4ccccc4c(-c4ccc(-c5cccc6ccccc56)cc4)c4ccccc34)ccc2c1]

BD: (E-7-(4-(diphenylamino)styryl)-N, N-diphenyl-9,9'-dimethylfluorenyl-2-amine)

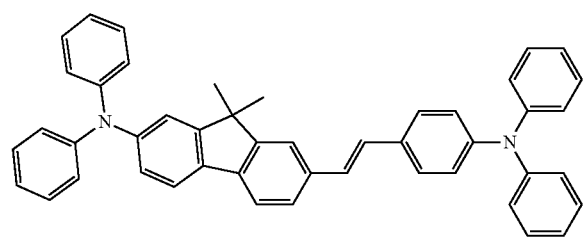 [SMILES: CC1(C)c2cc(/C=C/c3ccc(N(c4ccccc4)c4ccccc4)cc3)ccc2-c2ccc(N(c3ccccc3)c3ccccc3)cc21]

Ala$_q$: (tris(8-hydroxyquinoline) aluminum)

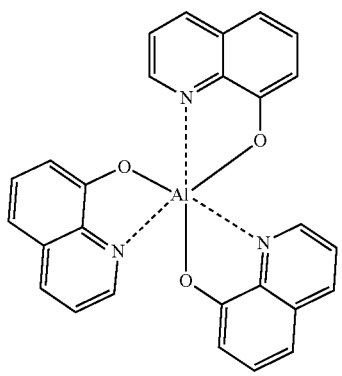

TBDB: (N, N, N', N'-4 (4-biphenyl) biphenyldiamine)

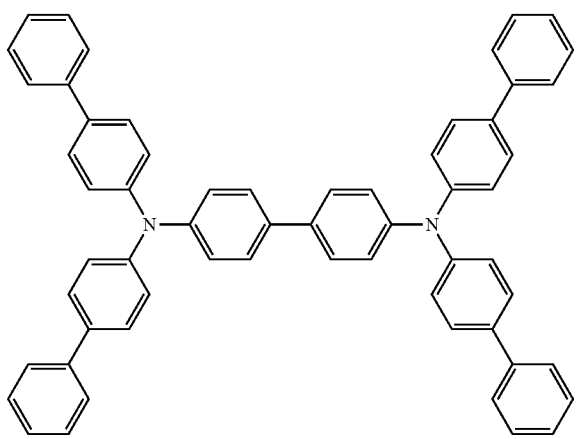 [SMILES: c1ccc(-c2ccc(N(c3ccc(-c4ccccc4)cc3)c3ccc(-c4ccc(N(c5ccc(-c6ccccc6)cc5)c5ccc(-c6ccccc6)cc5)cc4)cc3)cc2)cc1]

Regarding the compounds described in this description, when the chemical formula names and the structural formulas are also described in this description at the same time, the structures of the compounds are based on the structural formulas.

Preparation Example 1

Synthesis of Compound [51]

In the presence of nitrogen, 15.0 g of N, N'-bis (3,5-di-tert-butylsalicylidene)-1,2 ethylenediamine (30 mmol), 21.6 g of boron trifluoride-ether complex (152 mmol), 300 ml of toluene, and 20 g of N, N-diisopropylethylamine (152 mmol) are added to a reactor, and stirred for 2.5 hour under heating at 40° C. After cooling to room temperature, 300 ml of water is added, and the filtrate is separated into an organic layer and an aqueous layer. The organic layer is washed twice with a saturated sodium carbonate aqueous solution and dried over magnesium sulfate. The obtained solid is recrystallized by using toluene (150 ml) and ethanol (750 ml) to obtain 17.89 g of a crude product. The crude product is sublimed at a pressure of $3\times10^{-3}$ Pa and a temperature of 220° C. to obtain the compound [51] (light yellow solid).

1HNMR (DMSO): δ8.28 to 7.10 (s, 6H), 4.31 to 4.27 (m, 4H), 1.57 to 1.40 (m, 36H).

HPLC (purity=99.0%)

Preparation Example 2

Synthesis of Compound [53]

In the presence of nitrogen, 12.32 g of 2,2'-[1,2-ethylenediylbis(nitrosomethylmethylene)]bis[5-(diethylamino)]phenol (30 mmol), 21.6 g of boron trifluoride-ether complex (152 mmol), 300 ml of toluene, and 20 g of N, N-diisopropylethylamine (152 mmol) are added to a reactor, and stirred for 2.5 hour under heating at 40° C. After cooling to room temperature, 300 ml of water is added, and the filtrate is separated into an organic layer and an aqueous layer. The organic layer is washed twice with a saturated sodium carbonate aqueous solution and dried over magnesium sulfate. The obtained solid is recrystallized by using toluene (150 ml) and ethanol (750 ml) to obtain 20.35 g of a crude product. The crude product is sublimed at a pressure of $3 \times 10^{-3}$ Pa and a temperature of 215° C. to obtain the compound [53] (light yellow solid).

1HNMR (DMSO): δ 8.40 to 7.15 (s, 8H), 4.30 to 4.27 (m, 4H), 3.70 to 3.82 (m, 8H), 1.21 to 1.30 (m, 12H).

HPLC (purity=98.9%)

Preparation Example 3

Synthesis of Compound [55]

In the presence of nitrogen, 9.85 g of 2,2'-[1,2-ethylenediylbis(nitrosomethylmethylene)]bis[5-(methoxyl)]phenol (30 mmol), 21.6 g of boron trifluoride-ether complex (152 mmol), 300 ml of toluene, and 20 g of N, N-diisopropylethylamine (152 mmol) are added to a reactor, and stirred for 2.5 hour under heating at 40° C. After cooling to room temperature, 300 ml of water is added, and the filtrate is separated into an organic layer and an aqueous layer. The organic layer is washed twice with a saturated sodium carbonate aqueous solution and dried over magnesium sulfate.

The obtained solid is recrystallized by using toluene (150 ml) and ethanol (750 ml) to obtain 17.56 g of a crude product. The crude product is sublimed at a pressure of $3 \times 10^{-3}$ Pa and a temperature of 220° C. to obtain the compound [55] (light yellow solid).

1HNMR (DMSO): δ 8.35 to 7.10 (s, 8H), 4.29 to 4.26 (m, 4H), 3.80 to 3.85 (s, 6H).

HPLC (purity=99.2%)

Preparation Example 4

Synthesis of Compound [69]

In the presence of nitrogen, 16.46 g of 2,2'-[(1,1,2,2-tetramethyl-1,2-ethanediyl)bis (nitromethyl)]bis[4,6-bis(1,1-dimethylethyl)]phenol (30 mmol), 21.6 g of boron trifluoride-ether complex (152 mmol), 300 ml of toluene, and 20 g of N, N-diisopropylethylamine (152 mmol) are added to a reactor, and stirred for 2.5 hour under heating at 40° C. After cooling to room temperature, 300 ml of water is added, and the filtrate is separated into an organic layer and an aqueous layer. The organic layer is washed twice with a saturated sodium carbonate aqueous solution and dried over magnesium sulfate. The obtained solid is recrystallized by using toluene (150 ml) and ethanol (750 ml) to obtain 18.78 g of a crude product. The crude product is sublimed at a pressure of $3 \times 10^{-3}$ Pa and a temperature of 225° C. to obtain the compound [69] (light yellow solid).

1HNMR (DMSO): δ 8.30 to 7.10 (s, 6H), 1.55 to 1.37 (m, 12H), 1.57 to 1.40 (m, 36H).

HPLC (purity=99.4%)

Preparation Example 5

Synthesis of Compound [70]

In the presence of nitrogen, 14.00 g of 2,2'-[(1,1,2,2-tetramethyl-1,2-ethanediyl)bis (nitromethyl)]bis[5-(diethylamino)] phenol (30 mmol), 21.6 g of boron trifluoride-ether complex (152 mmol), 300 ml of toluene, and 20 g of N, N-diisopropylethylamine (152 mmol) are added to a reactor, and stirred for 2.5 hour under heating at 40° C. After cooling to room temperature, 300 ml of water is added, and the filtrate is separated into an organic layer and an aqueous layer. The organic layer is washed twice with a saturated sodium carbonate aqueous solution and dried over magnesium sulfate. The obtained solid is recrystallized by using toluene (150 ml) and ethanol (750 ml) to obtain 16.55 g of a crude product. The crude product is sublimed at a pressure of $3 \times 10^{-3}$ Pa and a temperature of 230° C. to obtain the compound [70] (light yellow solid).

1HNMR (DMSO): δ 8.30 to 7.10 (s, 8H), 3.70 to 3.82 (m, 8H), 1.55 to 1.37 (m, 12H), 1.21 to 1.30 (m, 12H).

HPLC (purity=98.9%)

Preparation Example 6

Synthesis of Compound [118]

In the presence of nitrogen, 16.40 g of N, N'-bis (3,5-di-tert-butylsalicylidene)-1,2-cyclohexanediamine (30 mmol), 21.6 g of boron trifluoride-ether complex (152 mmol), 300 ml of toluene, and 20 g of N, N-diisopropylethylamine (152 mmol) are added to a reactor, and stirred for 2.5 hour under heating at 40° C. After cooling to room temperature, 300 ml of water is added, and the filtrate is separated into an organic layer and an aqueous layer. The organic layer is washed twice with a saturated sodium carbonate aqueous solution and dried over magnesium sulfate. The obtained solid is recrystallized by using toluene (150 ml) and ethanol (750 ml) to obtain 18.16 g of a crude product. The crude product is sublimed at a pressure of $3 \times 10^{-3}$ Pa and a temperature of 230° C. to obtain the compound [118] (light yellow solid).

1HNMR (DMSO): δ8.28 to 7.10 (s, 6H), 3.51 to 3.54 (s, 2H), 2.13 to 2.25 (i, 4H), 1.68 to 1.72 (i, 4H), 1.55 to 1.40 (m, 36H).

HPLC (purity=99.6%)

Preparation Example 7

Synthesis of Compound [124]

In the presence of nitrogen, 13.93 g of 2,2'-[1,2-cyclohexanediylbis(o-methylmethine)]bis[5-(diethylamino)]phenol (30 mmol), 21.6 g of boron trifluoride-ether complex (152 mmol), 300 ml of toluene, and 20 g of N, N-diisopropylethylamine (152 mmol) are added to a reactor, and stirred for 2.5 hour under heating at 40° C. After cooling to room temperature, 300 ml of water is added, and the filtrate is separated into an organic layer and an aqueous layer. The organic layer is washed twice with a saturated sodium carbonate aqueous solution and dried over magnesium sulfate. The obtained solid is recrystallized by using toluene (150 ml) and ethanol (750 ml) to obtain 17.56 g of a crude product. The crude product is sublimed at a pressure of $3 \times 10^{-3}$ Pa and a temperature of 230° C. to obtain the compound [124] (light yellow solid).

1HNMR (DMSO): 8.28 to 7.10 (s, 8H), 3.51 to 3.54 (s, 2H), 2.13 to 2.25 (m, 4H), 1.68 to 1.72 (m, 4H), 3.70 to 3.82 (m, 8H), 1.21 to 1.30 (m, 12H).

HPLC (purity=99.5%)

Preparation Example 8

Synthesis of Compound [136]

In the presence of nitrogen, 13.13 g of N, N'-bis[2-[N-2, 4-di-tert-butyl salicylidene 1-ethylamine] methylamine (30 mmol), 21.6 g of boron trifluoride-ether complex (152 mmol), 300 ml of toluene, and 20 g of N, N-diisopropyl-ethylamine (152 mmol) are added to a reactor, and stirred for 2.5 hour under heating at 40° C. After cooling to room temperature, 300 ml of water is added, and the filtrate is separated into an organic layer and an aqueous layer. The organic layer is washed twice with a saturated sodium carbonate aqueous solution and dried over magnesium sulfate. The obtained solid is recrystallized by using toluene (150 ml) and ethanol (750 ml) to obtain 17.56 g of a crude product. The crude product is sublimed at a pressure of $3 \times 10^{-3}$ Pa and a temperature of 220° C. to obtain the compound [136] (light yellow solid).

1HNMR (DMSO): δ 8.28 to 7.10 (s, 6H), 4.02 to 4.14 (m, 4H), 3.12 to 3.25 (m, 4H), 2.67 (s, 3H), 1.55 to 1.40 (m, 36H).

HPLC (purity=99.8%)

Example 1

The alkali-free glass is ultrasonically washed in isopropyl alcohol for 15 minutes, and then subjected to UV ozone washing treatment in the atmosphere for 30 minutes. A reflective anode is formed by using a sputtering method to sequentially form a film of silver (Ag) of 100 nm and a film of ITO of 10 nm on the alkali-free glass. After the reflective anode is subjected to the UV ozone washing treatment for 10 minutes, a vacuum evaporation method is used to sequentially laminate a hole injection layer (NPD and F4-TCNQ (weight ratio of 97:3), 50 nm), a hole transport layer (NPD, 80 nm), a blue light-emitting layer (BH and BD (weight ratio of 97:3, 20 nm), an electron transport layer ($Alq_3$, 35 nm), and an electron injection layer (LiF, 1 nm) by evaporation on the anode, and Mg and Ag (weight ratio of 10:1, 15 nm) are then co-evaporated to obtain a translucent cathode. Next, on the translucent cathode, a compound [51](i.e., cover layer 1) having a film thickness of 10 nm, a wavelength of 460 nm and a refractive index of 1.56 and a compound [TBDB] (i.e., cover layer 2) having a film thickness of 50 nm, a wavelength of 460 nm and a refractive index of 2.06 are sequentially evaporated on the translucent cathode. Finally, in a glove box with a dry nitrogen atmosphere, a sealing board made of alkali-free glass is sealed with an epoxy resin binder to manufacture a light-emitting element.

The above-mentioned light-emitting element is applied with a direct current of 10 $mA/cm^2$ at room temperature and in the atmosphere. The brightness and the color purity of light from the sealing board are tested with a spectroradiometer (CS1000, Konica Minolta Co., Ltd.). Based on the above measured values, the photometric efficiency is 5.3 cd/A, and the color purity is CIE (x, y)=(0.138, 0.050).

As can be seen from the results shown in Table 1, when the compound [51] is used as the cover layer, a high-performance light-emitting element with high light-emitting efficiency and high color purity is obtained.

Example 2

Except that the cover layer 1 is the compound [53], the rest is the same as in Example 1.

The organic light-emitting element is evaluated. The evaluation results are shown in Table 1.

Example 3

Except that the cover layer 1 is the compound [55], the rest is the same as in Example 1.

The organic light-emitting element is evaluated. The evaluation results are shown in Table 1.

Example 4

Except that the cover layer 1 is the compound [70], the rest is the same as in Example 1.

The organic light-emitting element is evaluated. The evaluation results are shown in Table 1.

Example 5

Except that the cover layer 1 is the compound [141], the rest is the same as in Example 1.

The organic light-emitting element is evaluated. The evaluation results are shown in Table 1.

Example 6

Except that the cover layer 1 is the compound [10], the rest is the same as in Example 1.

The organic light-emitting element is evaluated. The evaluation results are shown in Table 1.

Example 7

Except that the cover layer 1 is the compound [154], the rest is the same as in Example 1.

The organic light-emitting element is evaluated. The evaluation results are shown in Table 1.

Example 8

Except that the cover layer 1 is the compound [159], the rest is the same as in Example 1.

The organic light-emitting element is evaluated. The evaluation results are shown in Table 1.

Example 9

Except that the cover layer 1 is TBDB and the cover layer 2 is NPD, the rest is the same as in Example 1.

The organic light-emitting element is evaluated. The evaluation results are shown in Table 1.

Example 10

Except that the cover layer 1 is TBDB and the cover layer 2 is $Alq_3$, the rest is the same as in Example 1.

The organic light-emitting element is evaluated. The evaluation results are shown in Table 1.

Example 11

Except that the cover layer 1 is the compound [51] and the cover layer 2 is the compound [141], the rest is the same as in Example 1.

The organic light-emitting element is evaluated. The evaluation results are shown in Table 1.

Example 12

Except that the cover layer 1 is the compound [160] and the cover layer 2 is TBDB, the rest is the same as in Example 1.

The organic light-emitting element is evaluated. The evaluation results are shown in Table 1.

Comparative Example 1

Except that the cover layer 1 is TBDB and the cover layer 2 is absent, the rest is the same as in Example 1.

The organic light-emitting element is evaluated. The evaluation results are shown in Table 1.

Comparative Example 2

Except that the cover layer 1 is the compound [51] and the cover layer 2 is absent, the rest is the same as in Example 1.

The organic light-emitting element is evaluated. The evaluation results are shown in Table 1.

TABLE 1

Performances of the Light-emitting Element
(Examples and Comparative Examples)

| | Cover layer material 1 | n1 (460) | Cover layer material 2 | n2 (460) | Luminous efficiency | Color purity CIE(x,y) |
|---|---|---|---|---|---|---|
| Example 1 | Compound [51] | 1.56 | TBDB | 2.06 | 5.3 cd/A | 0.138, 0.050 |
| Example 2 | Compound [53] | 1.60 | TBDB | 2.06 | 5.2 cd/A | 0.139, 0.051 |
| Example 3 | Compound [55] | 1.61 | TBDB | 2.06 | 5.0 cd/A | 0.140, 0.048 |
| Example 4 | Compound [70] | 1.65 | TBDB | 2.06 | 4.9 cd/A | 0.140, 0.049 |
| Example 5 | Compound [141] | 1.70 | TBDB | 2.06 | 4.5 cd/A | 0.141, 0.047 |
| Example 6 | Compound [10] | 1.66 | TBDB | 2.06 | 4.0 cd/A | 0.141, 0.045 |
| Example 7 | Compound [154] | 1.64 | TBDB | 2.06 | 4.3 cd/A | 0.141, 0.047 |
| Example 8 | Compound [159] | 1.59 | TBDB | 2.06 | 5.1 cd/A | 0.139, 0.047 |
| Example 9 | TBDB | 2.06 | NPD | 1.92 | 3.2 cd/A | 0.138, 0.052 |
| Example 10 | TBDB | 2.06 | Alq3 | 1.82 | 3.1 cd/A | 0.138, 0.052 |
| Example 11 | Compound [51] | 1.56 | Compound | 1.70 | 3.3 cd/A | 0.141, 0.049 |
| Example 12 | Compound [160] | 1.69 | TBDB | 2.06 | 4.4 cd/A | 0.141, 0.047 |
| Comparative example 1 | TBDB | 2.06 | None | — | 3.0 cd/A | 0.141, 0.046 |
| Comparative example 2 | Compound [51] | 1.56 | None | — | 2.0 cd/A | 0.141, 0.045 |

In the table, n1 (460) is the refractive index of the cover layer material 1 at a wavelength of 460 nm. n2 (460) is the refractive index of the cover layer material 2 at a wavelength of 460 nm.

As shown in Table 1 above, the light-emitting elements of Examples 1 to 8 and 12 satisfy both high light-emitting efficiency and high color purity. In the light-emitting elements of Examples 9 to 11, the difference in refractive indexes between the cover layer material 1 and the cover layer material 2 is less than 0.3, and the light-emitting efficiency is slightly lower. In addition, the light-emitting elements of Comparative Examples 1 to 2 have the same color purity as the examples, but the light-emitting efficiency is significantly lower than that of the examples. Therefore, the light-emitting elements of Comparative Examples 1 to 2 cannot satisfy both high light-emitting efficiency and high color purity.

All patent documents and non-patent documents mentioned in this description are incorporated herein by reference. The "a plurality of" mentioned in this description includes all cases where more than one, that is, "one or more" includes one, two, three, and the like. When the upper and lower limits are described separately for a certain numerical range in this description, or when a certain numerical range is described as a combination of upper and lower limits, the upper and lower limits described therein can be arbitrarily combined into a new numerical range, which should be considered to be the same as the description form of the numerical range that is directly and explicitly combined. Those skilled in the art can make changes and improvements to the present invention without departing from the spirit of the present invention, and these are also included in the scope of the present invention.

The invention claimed is:

1. An organic light-emitting element, comprising a substrate, a first electrode, more than one organic layer film comprising a light-emitting layer, and a second electrode, wherein the light-emitting element further comprises a cover layer; the cover layer comprises a low refractive layer; and the low refractive layer is formed from an organic small molecular compound, wherein the organic light element contains a boron complex compound represented by the following formula 1:

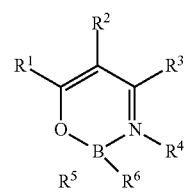

Formula 1 in which, $R^1$ to $R^4$ are the same or different and are each independently selected from one or more of the group consisting of hydrogen, deuterium, optionally substituted alkyl group, optionally substituted cycloalkyl group, optionally substituted heterocyclic group, optionally substituted alkenyl group, optionally substituted cycloalkenyl group, optionally substituted alkynyl group, optionally substituted alkoxyl group, optionally substituted alkyl sulphanyl group, optionally substituted aryl ether group group, optionally substituted aryl sulfide group group, optionally substituted aryl group, optionally substituted heteroaryl group, optionally substituted carbonyl group, optionally substituted carboxyl group, optionally substituted oxycarbonyl group, optionally substituted carbamoyl group, optionally substituted alkylamino group, or optionally substituted silanyl group-; $R^5$ to $R^6$ are the same or different and are each independently selected from fluorine, alkoxyl group, aryl ether group or aryl group; $R^1$ and $R^2$ can be bonded to form a ring; and in the case of being substituted, substituents are each independently selected from one or more of the group consisting of deuterium, halogen, C1-C15 alkyl group, C3-C15 cycloalkyl group, C3-C15 heterocyclic group, C2-C15 alkenyl group, C4-C15 cycloalkenyl group, C2-C15 alkynyl group, C1-C15 alkoxyl group, C1-C15 alkyl sulphanyl group, C6-C55 aryl ether group, C6-C55 aryl sulfide group, C6-C55 aryl group, C5-55 aromatic heterocyclic group, carbonyl group, carboxyl group, oxycarbonyl group, carbamoyl group, C1-C40 alkylamino group or C3-C15 silanyl group with 1-5 silicon atoms.

2. The organic light-emitting element according to claim 1, wherein the boron complex compound is represented by the following formula 2:

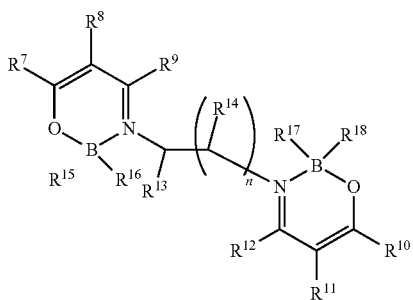

Formula 2 in which, $R^7$ to $R^{14}$ are the same or different and are each independently selected from one or more of the group consisting of hydrogen, deuterium, optionally substituted alkyl group, optionally substituted cycloalkyl group, optionally substituted heterocyclic group, optionally substituted alkenyl group, optionally substituted cycloalkenyl group, optionally substituted alkynyl group, optionally substituted alkoxyl group, optionally substituted alkyl sulphanyl group, optionally substituted aryl ether group group, optionally substituted aryl sulfide group group, optionally substituted aryl group, optionally substituted heteroaryl group, optionally substituted carbonyl group, optionally substituted carboxyl group, optionally substituted oxycarbonyl group, optionally substituted carbamoyl group, optionally substituted alkylamino group, or optionally substituted silanyl group; $R^{13}$ to $R^{14}$ may be bonded to form a ring; $R^{15}$ to $R^{18}$ are the same or different and are each independently selected from fluorine, alkoxyl group, aryl ether group or aryl group; n is an integer from 1 to 3; $R^7$ and $R^8$ can be bonded to form a ring; and $R^{10}$ and $R^{11}$ can be bonded to form a ring; and in the case of being substituted, substituents are each independently selected from one or more of the group consisting of deuterium, halogen, C1-C15 alkyl group, C3-C15 cycloalkyl group, C3-C15 heterocyclic group, C2-C15 alkenyl group, C4-C15 cycloalkenyl group, C2-C15 alkynyl group, C1-C15 alkoxyl group, C1-C15 alkyl sulphanyl group, C6-C55 aryl ether group, C6-C55 aryl sulfide group, C6-C55 aryl group, C5-55 aromatic heterocyclic group, carbonyl group, carboxyl group, oxycarbonyl group, carbamoyl group, C1-C40 alkylamino group or C3-C15 silanyl group with 1-5 silicon atoms.

3. The organic light-emitting element according to claim 2, wherein $R^{15}$ to $R^{18}$ are fluorine.

4. The organic light-emitting element according to claim 2, wherein the boron complex compound is represented by the following formula 3:

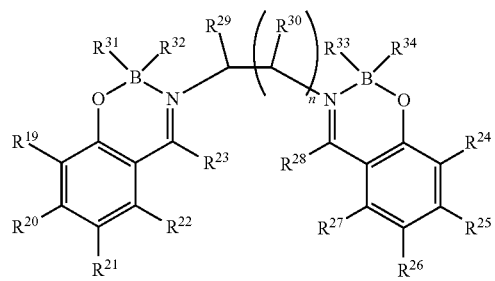

Formula 3 in which, $R^{19}$ to $R^{30}$ are the same or different and are each independently selected from one or more of the group consisting of hydrogen, deuterium, optionally substituted alkyl group, optionally substituted cycloalkyl group, optionally substituted heterocyclic group, optionally substituted alkenyl group, optionally substituted cycloalkenyl group, optionally substituted alkynyl group, optionally substituted alkoxyl group, optionally substituted alkyl sulphanyl group, optionally substituted aryl ether group group, optionally substituted aryl sulfide group group, optionally substituted aryl group, optionally substituted heteroaryl group, optionally substituted carbonyl group, optionally substituted carboxyl group, optionally substituted oxycarbonyl group, optionally substituted carbamoyl group, optionally substituted alkylamino group, or optionally substituted silanyl group; $R^{29}$ to $R^3$ may also be bonded to form a ring; $R^{31}$ to $R^{34}$ are the same or different and are each independently selected from fluorine, alkoxyl group, aryl ether group or aryl group; n is an integer from 1 to 3; and in the case of being substituted, substituents are each independently selected from one or more of the group consisting of deuterium, halogen, C1-C6 alkyl group, C3-C6 cycloalkyl group, C3-C6 heterocyclic group, C2-C6 alkenyl group, C4-C6 cycloalkenyl group, C2-C6 alkynyl group, C1-C6 alkoxyl group, or C1-C6 alkyl sulphanyl group.

5. The organic light-emitting element according to claim 4, wherein at least three of $R^{19}$ to $R^{22}$ and $R^{24}$ to $R^{27}$ are not hydrogen.

6. The organic light-emitting element according to claim 4, wherein $R^{31}$ to $R^{34}$ are fluorine.

7. The organic light-emitting element according to claim 2, wherein n is 1.

8. The organic light-emitting element according to claim 1, wherein the cover layer is disposed on the second electrode, and the cover layer comprises a high refractive layer and the low refractive layer.

9. The organic light-emitting element according to claim 8, wherein the high refractive layer has a refractive index of 1.8 or more; and the low refractive layer has a refractive index of 1.5 to 1.7.

10. The organic light-emitting element according to claim 8, wherein a difference between the refractive index of the high refractive layer and the refractive index of the low refractive layer is 0.3 or more.

11. The organic light-emitting element according to claim 8, wherein the high refractive layer is formed from at least one of the following inorganic compounds and organic compounds, wherein the inorganic compound is one or more of SiOx, SiNy, ZnS, ZnSe, ZrO or $TiO_2$, in which said x, y are independently an integer from 1 to 4; the organic compound is one or more an arylamine derivative, a carbazole derivative, a benzimidazole derivative or a triazole derivative.

12. The organic light-emitting element according to claim 1, wherein the low refractive layer of the cover layer contains a boron complex compound.

13. The organic light-emitting element according to claim 1, wherein $R^5$ to $R^6$ are fluorine.

* * * * *

UNITED STATES PATENT AND TRADEMARK OFFICE
CERTIFICATE OF CORRECTION

PATENT NO. : 11,296,304 B2
APPLICATION NO. : 16/761553
DATED : April 5, 2022
INVENTOR(S) : Peng Wang et al.

It is certified that error appears in the above-identified patent and that said Letters Patent is hereby corrected as shown below:

In the Claims

In Claim 1, Column 58, Line 64, "tuted aryl sulfide group group, optionally substituted" should read -- tuted aryl sulfide group, optionally substituted --

In Claim 2, Column 59, Line 48, "tuted aryl sulfide group group, optionally substituted" should read -- tuted aryl sulfide group, optionally substituted --

In Claim 4, Column 60, Line 34, "substituted aryl sulfide group group, optionally substi" should read -- substituted aryl sulfide group, optionally substi --

In Claim 4, Column 60, Line 41, "$R^{29}$ to $R^3$ may also be bonded" should read -- $R^{29}$ to $R^{30}$ may also be bonded --

Signed and Sealed this
Nineteenth Day of July, 2022

Katherine Kelly Vidal
*Director of the United States Patent and Trademark Office*